(12) United States Patent  (10) Patent No.: US 7,423,926 B2
Imai et al.  (45) Date of Patent: Sep. 9, 2008

(54) SEMICONDUCTOR MEMORY

(75) Inventors: Seiro Imai, Kanagawa (JP); Yukihiro Fujimoto, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 106 days.

(21) Appl. No.: 11/562,225

(22) Filed: Nov. 21, 2006

(65) Prior Publication Data

US 2007/0127305 A1  Jun. 7, 2007

(30) Foreign Application Priority Data

Nov. 24, 2005  (JP)  ............................ 2005-339445

(51) Int. Cl.
*G11C 8/00*  (2006.01)
(52) U.S. Cl. .............................. 365/230.05; 365/189.04
(58) Field of Classification Search ............ 365/230.05, 365/189.04, 154
See application file for complete search history.

(56) References Cited

U.S. PATENT DOCUMENTS 5,923,593 A * 7/1999 Hsu et al. ............... 365/189.04
6,515,887 B2  2/2003 Fujimoto
6,885,608 B2 * 4/2005 Nagano ................. 365/230.05

FOREIGN PATENT DOCUMENTS

JP  2003-132684  5/2003

* cited by examiner

*Primary Examiner*—Anh Phung
(74) *Attorney, Agent, or Firm*—Oblon, Spivak, McClelland, Maier & Neustadt, P.C.

(57) ABSTRACT

A semiconductor memory includes memory cells for even addresses arranged in a first memory array and storing even addressed data, word lines for even addresses arranged parallel to a row direction of the first memory array and selecting the memory cells for even addresses, bit lines for even addresses arranged parallel to a column direction of the first memory array and transferring the even addressed data to the memory cells for even addresses, memory cells for odd addresses arranged in a second memory array and storing odd addressed data, word lines for odd addresses arranged parallel to a row direction of the second memory array and selecting the memory cells for odd addresses, and bit lines for odd addresses arranged parallel to a column direction of the second memory array and transferring the odd addressed data to the memory cells for odd addresses.

17 Claims, 9 Drawing Sheets

SEMICONDUCTOR MEMORY

CROSS REFERENCE TO RELATED APPLICATIONS AND INCORPORATION BY REFERENCE

This application is based upon and claims the benefit of priority from prior Japanese Patent Application P2005-339445 filed on Nov. 24, 2005; the entire contents of which are incorporated by reference herein.

BACKGROUND OF THE INVENTION

1. Field of the Invention

The present invention relates to a semiconductor memory and in particular to a static random access memory (SRAM).

2. Description of the Related Art

As described in Japanese Patent Laid-Open Publication No. 2003-132684, the SRAM cell can be classified into two types. One is a single port SRAM cell including an input/output port for a single data transfer. Another is a multi port SRAM cell including a plurality of input/output ports for a plurality of data transfers. Further, the multi port SRAM cell can be classified into two types. One is a one read and one write SRAM cell including a single write port and a single read port. Another is a one read and two write SRAM cell including the two write ports and the single read port.

The typical semiconductor memory includes the plurality of SRAM cells arranged in an array. Therefore, when the start row address of sequential data to be written is even and the end row address of the sequential data is odd, the sequential data are written in the plurality of SRAM cells disposed over a plurality of rows. If the plurality of one read and one write SRAM cells are used for the semiconductor memory, the data associated with even row address are unintentionally written in the SRAM cell of which the row address is odd. Or, the data associated with odd row address are unintentionally written in the SRAM cell of which the row address is even. Accordingly, the semiconductor memory, such as the buffer memory, used for storing such sequential data has necessarily used the plurality of one read and two write SRAM cells or the plurality of two read and two write SRAM cells. However, the one read and two write SRAM cell and the two read and two write SRAM cell are more expensive than the one read and one write SRAM cell.

SUMMARY OF THE INVENTION

An aspect of present invention inheres in a semiconductor memory according to an embodiment of the present invention. The semiconductor memory includes a plurality of memory cells for even addresses arranged in a memory array for even addresses and configured to store even addressed data, the even addressed data being associated with even row addresses, a plurality of write word lines for even addresses arranged parallel to a row direction of the memory array for even addresses and configured to select the plurality of memory cells for even addresses in the row direction of the memory array for even addresses to write the even addressed data, a plurality of write bit lines for even addresses arranged parallel to a column direction of the memory array for even addresses and configured to transfer the even addressed data to the plurality of memory cells for even addresses in the column direction of the memory array for even addresses, a plurality of memory cells for odd addresses arranged in a memory array for odd addresses and configured to store odd addressed data, the odd addressed data being associated with odd row addresses, a plurality of write word lines for odd addresses arranged parallel to a row direction of the memory array for odd addresses and configured to select the plurality of memory cells for odd addresses in the row direction of the memory array for odd addresses to write the odd addressed data, and a plurality of write bit lines for odd addresses arranged parallel to a column direction of the memory array for odd addresses and configured to transfer the odd addressed data to the plurality of memory cells for odd addresses in the column direction of the memory array for odd addresses.

DETAILED DESCRIPTION OF THE INVENTION

Figure 1:
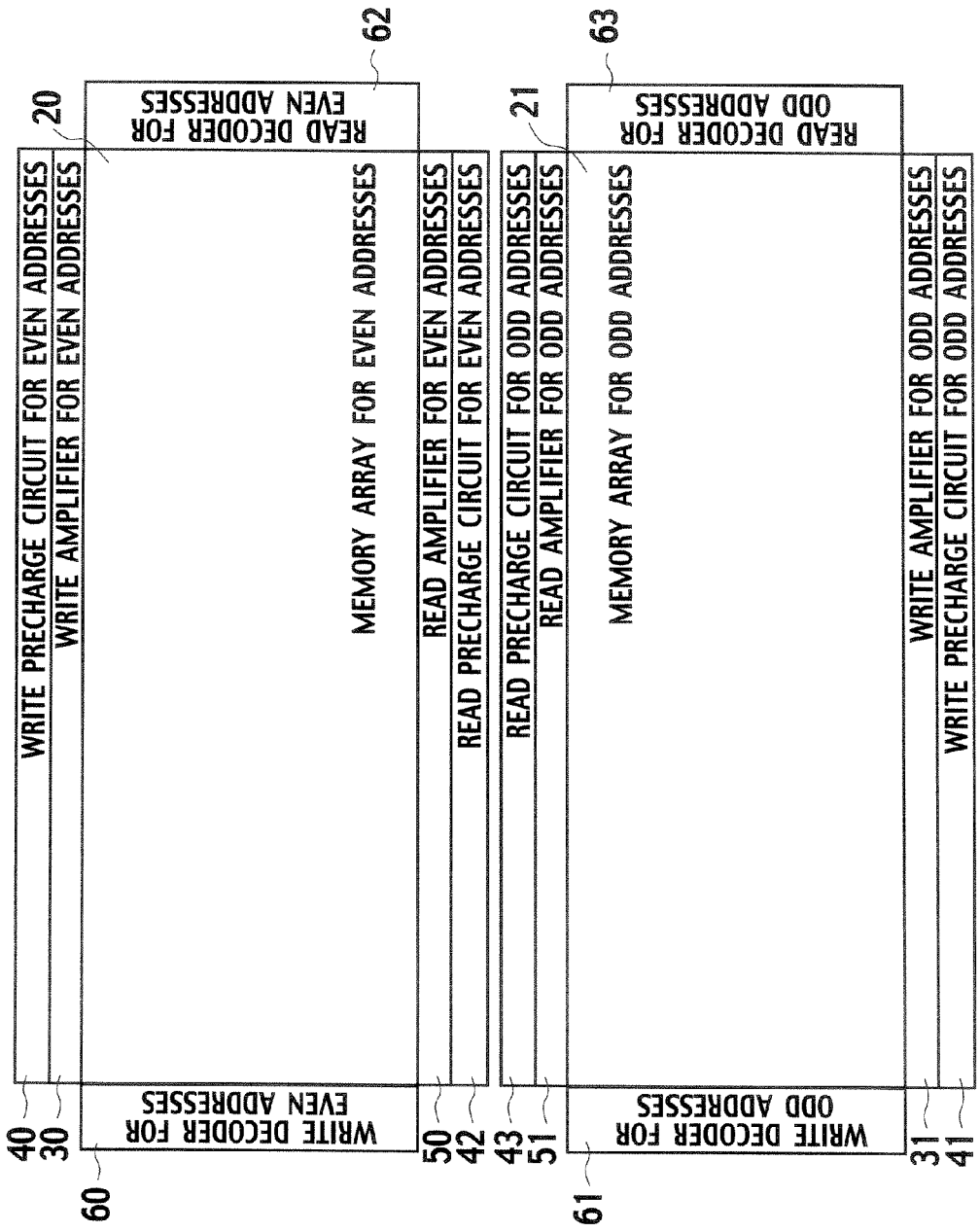
FIG. 1 is a diagram of a semiconductor memory in accordance with a first embodiment of the present invention.

Embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

Figure 2:
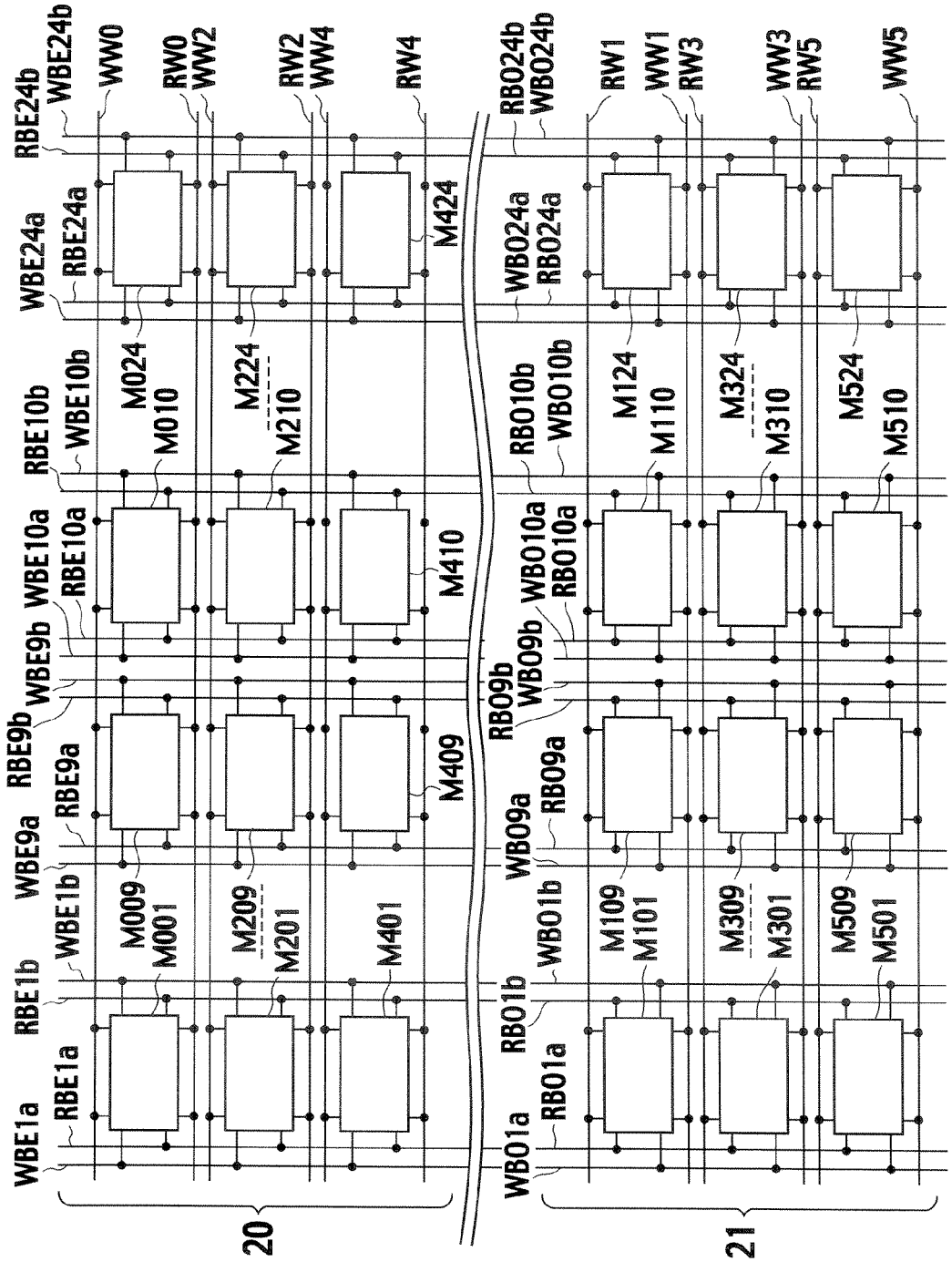
FIG. 2 is a circuit diagram of memory arrays of the semiconductor memory in accordance with the first embodiment of the present invention.

With reference to FIG. 1, a semiconductor memory, according to the first embodiment, includes a memory array 20 for even addresses and a memory array 21 for odd addresses. It is possible to write any 24 bit of 144 bit address space in the semiconductor memory, for example. With reference to FIG. 2, a plurality of memory cells M001, . . . , M009, M010, . . . , M024 , M201, . . . , M209, M210, . . . , M224, M401, . . . , M409, M410, . . . , M424 for even addresses are disposed in the memory array 20 for even addresses. The plurality of memory cells M001-M424 for even addresses are arranged in an array of three rows and 24 columns. The plurality of memory cells M001-M424 for even addresses are configured to store even addressed data. "The even addressed data" are associated with even row addresses, respectively. Here, zero is included in the even numbers. Specifically, each of the plurality of memory cells M001, . . . , M009, M010, . . . , M024 for even addresses stores the even addressed data associated with the row address "0". Each of the plurality of memory cells M201, . . . , M209, M210, . . . , M224 for even addresses stores the even addressed data associated with the row address "2". Each of the plurality of memory cells M401, . . . , M409, M410, . . . , M424 for even addresses stores the even addressed data associated with the row address "4".

The plurality of memory cells M001, . . . , M009, M010, . . . , M024 for even addresses are disposed in a row direction of the memory array 20 for even addresses. The plurality of memory cells M201, . . . , M209, M210, . . . , M224 for even addresses are parallel with the plurality of memory cells M001, . . . , M009, M010, . . . , M024 for even addresses. The plurality of memory cells M401, . . . , M409, M410, . . . , M424 for even addresses are parallel with the plurality of memory cells M201, . . . , M209, M210, M224 for even addresses.

Further, the memory array 20 for even addresses includes a plurality of write word lines WW0, WW2, WW4 for even addresses. The plurality of write word lines WW0, WW2, WW4 for even addresses are configured to access the plurality of memory cells M001-M024, M201-M224, M401-M424 in the row direction, during a write operation of the even addressed data. The plurality of write word lines WW0, WW2, WW4 for even addresses are parallel with the row direction of the memory array 20 for even addresses. Specifically, the write word line WW0 for even addresses is electrically connected to gates of a pair of write transistors in each of the plurality of memory cells M001-M024 for even addresses, as described below. The write word line WW2 for even addresses is electrically connected to gates of a pair of write transistors in each of the plurality of memory cells M201-M224 for even addresses. The write word line WW4 for even addresses is electrically connected to gates of a pair of write transistors in each of the plurality of memory cells M401-M424 for even addresses.

Also, the memory array 20 for even addresses includes a plurality of read word lines RW0, RW2, RW4 for even addresses. The plurality of read word lines RW0, RW2, RW4 for even addresses are configured to access the plurality of memory cells M001-M024, M201-M224, M401-M424 in the row direction, during a read operation of the even addressed data. The plurality of read word lines RW0, RW2, RW4 for even addresses are parallel with the row direction of the memory array 20 for even addresses. The read word line RW0 for even addresses is electrically connected to gates of a pair of read transistors in each of the plurality of memory cells M001-M024 for even addresses, as described below. The read word line RW2 for even addresses is electrically connected to gates of a pair of read transistors in each of the plurality of memory cells M201-M224 for even addresses. The read word line RW4 for even addresses is electrically connected to gates of a pair of read transistors in each of the plurality of memory cells M401-M424 for even addresses.

The memory array 20 for even addresses further includes a plurality of write bit lines WBE1a, WBE1b, . . . , WBE9a, WBE9b, WBE10a, WBE10b, WBE24a, WBE24b for even addresses. The plurality of write bit lines WBE1a, WBE1b, . . . , WBE9a, WBE9b, WBE10a, WBE10b, . . . WBE24a, WBE24b for even addresses are configured to transfer the even addressed data to be written to each of the plurality of the memory cells M001-M024, M201-M224, M401-M424 for even addresses in a column direction of the memory array 20 for even addresses, during the write operation. The plurality of write bit lines WBE1a, WBE1b, . . . , WBE9a, WBE9b, WBE10a, WBE10b, . . . WBE24a, WBE24b for even addresses are parallel with the column direction. The pair of write bit lines WBE1a, WBE1b for even addresses is electrically connected to drain regions of the pair of write transistors in each of the plurality of memory cells M001, M201, M401 for even addresses configured to store the even addressed data associated with the column address "1" and the even row address, respectively. The pair of write bit lines WBE9a, WBE9b for even addresses is electrically connected to drain regions of the pair of write transistors in each of the plurality of memory cells M009, M209, M409 for even addresses configured to store the even addressed data associated with the column address "9" and the even row address, respectively. The pair of write bit lines WBE10a, WBE10b for even addresses is electrically connected to drain regions of the pair of write transistors in each of the plurality of memory cells M010, M210, M410 for even addresses configured to store the even addressed data associated with the column address "10" and the even row address, respectively. The pair of write bit lines WBE24a, WBE24b for even addresses is electrically connected to drain regions of the pair write transistors in each of the plurality of memory cells M024, M224, M424 for even addresses configured to store the even addressed data associated with the column address "24" and the even row address, respectively.

The memory array 20 for even addresses further includes a plurality of read bit lines RBE1a, RBE1b, . . . , RBE9a, RBE9b, RBE10a, RBE10b, . . . RBE24a, RBE24b for even addresses. The plurality of read bit lines RBE1a, RBE1b, . . . , RBE9a, RBE9b, RBE10a, RBE10b, . . . RBE24a, RBE24b for even addresses are configured to transfer the even addressed data to be read from each of the plurality of memory cells M001-M024, M201-M224, M401-M424 for even addresses in the column direction, during the read operation. The plurality of read bit lines RBE1a, RBE1b, . . . , RBE9a, RBE9b, RBE10a, RBE10b, RBE24a, RBE24b for even addresses are parallel with the column direction of the memory array 20 for even addresses. The pair of read bit lines RBE1a, RBE1b for even addresses is electrically connected to drain regions of the pair of read transistors in each of the memory cells M001, M201, M401 for even addresses configured to store the even addressed data associated with the column address "1" and the even row address, respectively. The pair of read bit lines RBE9a, RBE9b for even addresses is electrically connected to drain regions of the pair of read transistors in each of the memory cells M009, M209, M409 for even addresses configured to store the even addressed data associated with the column address "9" and the even row address, respectively. The pair of read bit lines RBE10a, RBE10b for even addresses is electrically connected to drain regions of the pair of read transistors in each of the memory cells M010, M210, M410 for even addresses configured to store the even addressed data associated with the column address "10" and the even row address, respectively. The pair of read bit lines RBE24a, RBE24b for even addresses is electrically connected to drain regions of the pair of read transistors in each of the memory cells M024, M224, M424 for even addresses configured to store the even addressed data associated with the column address "24" and the even row address, respectively.

When the even addressed data is written in each of the plurality of memory cells M001-M024, M201-M224, M401-M424 for even addresses, a write decoder 60 for even addresses, shown in FIG. 1, transfers an even address signal for the write operation to each of the plurality of write word lines WW0, WW2, WW4 for even addresses, shown in FIG. 2, to select the row address for the even addressed data to be stored. When the even addressed data is read from each of the plurality of memory cells M001-M024, M201-M224, M401-M424 for even addresses, a read decoder 62 for even addresses, shown in FIG. 1, transfers an even address signal for the read operation to each of the plurality of read word lines RW0, RW2, RW4 for even addresses, shown in FIG. 2, to select the row address for the even addressed data to be read.

A write precharge circuit 40 for even addresses, shown in FIG. 1, is configured to precharge a high level voltage to each of the plurality of write bit lines WBE1a, WBE1b, . . . , WBE24a, WBE24b for even addresses, shown in FIG. 2. A write amplifier 30 for even addresses, shown in FIG. 1, is configured to write the even addressed data to each of the plurality of memory cells M001-M024, M201-M224, M401-M424 for even addresses, shown in FIG. 2, through the plurality of write bit lines WBE1a, WBE1b, . . . , WBE24a, WBE24b for even addresses. A read precharge circuit 42 for even addresses, shown in FIG. 1, is configured to precharge the high level voltage to each of the plurality of read bit lines RBE1a, RBE1b, . . . , RBE24a, RBE24b for even addresses, shown in FIG. 2. A read amplifier 50 for even addresses, shown in FIG. 1, is configured to read the even addressed data from each of the plurality of memory cells M001-M024, M201-M224, M401-M424 for even addresses, shown in FIG. 2, through the plurality of read bit lines RBE1a, RBE1b, RBE24a, RBE24b for even addresses.

A plurality of memory cells M101, . . . , M109, M110, M124, M301, . . . , M309, M310, . . . , M324, M501, . . . , M509, M510, . . . , M524 for odd addresses are disposed in the memory array 21 for odd addresses, shown in FIG. 1. The plurality of memory cells M101-M524 for odd addresses are arranged in the array of three rows and 24 columns. The plurality of memory cells M101-M524 for odd addresses are configured to store odd addressed data. "The odd addressed data" are associated with odd row addresses, respectively. Specifically, each of the plurality of memory cells M101, . . . , M109, M110, . . . , M124 for odd addresses stores the odd addressed data associated with the row address "1". Each of the plurality of memory cells M301, . . . , M309, M310, . . . , M324 for odd addresses stores the odd addressed data associated with the row address "3". Each of the plurality of memory cells M501, . . . , M509, M510, . . . , M524 for odd addresses stores the odd addressed data associated with the row address "5".

The plurality of memory cells M101, . . . , M109, M110, M124 for odd addresses are disposed in the row direction of the memory array 21 for odd addresses. The plurality of memory cells M301, . . . , M309, M310, . . . , M324 for odd addresses are parallel with the plurality of memory cells M101, . . . , M109, M110, . . . , M124 for odd addresses, respectively. The plurality of memory cells M501, . . . , M509, M510, . . . , M524 for odd addresses are parallel with the plurality of memory cells M301, M309, M310, . . . , M324 for odd addresses, respectively.

Further, the memory array 21 for odd addresses includes a plurality of write word lines WW1, WW3, WW5 for odd addresses. The plurality of write word lines WW1, WW3, WW5 for odd addresses are configured to access the plurality of memory cells M101-M124, M301-M324, M501-M524 for odd addresses in the row direction, during a write operation of the odd addressed data. The plurality of write word lines WW1, WW3, WW5 for odd addresses are parallel with the row direction of the memory array 21 for odd addresses. Specifically, the write word line WW1 for odd addresses is electrically connected to gates of a pair of write transistors in each of the plurality of memory cells M101-M124 for odd addresses. The write word line WW3 for odd addresses is electrically connected to gates of a pair of write transistors in each of the plurality of memory cells M301-M324 for odd addresses. The write word line WW5 for odd addresses is electrically connected to gates of a pair of write transistors in each of the plurality of memory cells M501-M524 for odd addresses.

Also, the memory array 21 for even addresses includes a plurality of read word lines RW1, RW3, RW5 for odd addresses. The plurality of read word lines RW1, RW3, RW5 for odd addresses are configured to access the plurality of memory cells M101-M124, M301-M324, M501-M524 for odd addresses in the row direction, during a read operation of the odd addressed data. The plurality of read word lines RW1, RW3, RW5 for odd addresses are parallel with the row direction of the memory array 21 for odd addresses. The read word line RW1 for odd addresses is electrically connected to gates of a pair of read transistors in each of the plurality of memory cells M101-M124 for odd addresses. The read word line RW3 for odd addresses is electrically connected to gates of a pair of read transistors in each of the plurality of memory cells M301-M324 for odd addresses. The read word line RW5 for odd addresses is electrically connected to gates of a pair of read transistors in each of the plurality of memory cells M501-M524 for odd addresses.

The memory array 21 for odd addresses further includes a plurality of write bit lines WBO1a, WBO1b, . . . , WB09a, WBO9b, WBO10a, WBO10b, . . . WBO24a, WBO24b for odd addresses. The plurality of write bit lines WBO1a, WBO1b, . . . , WBO9a, WBO9b, WBO10a, WBO10b, WBO24a, WBO24b for odd addresses are configured to transfer the odd addressed data to be written to each of the plurality of memory cells M101-M124, M301-M324, M501-M524 for odd addresses in the column direction, during the write operation. The plurality of write bit lines WBO1a, WBO1b, . . . , WBO9a, WB09b, WBO10a, WBO10b, . . . WBO24a, WBO24b for odd addresses are parallel with the column direction of the memory array 21 for odd addresses. The pair of write bit lines WBO1a, WBO1b for odd addresses is electrically connected to drain regions of the pair of write transistors in each of the plurality of memory cells M101, M301, M501 for odd addresses configured to store the odd addressed data associated with the column address "1" and the odd row address. The pair of write bit lines WBO9a, WBO9b for odd addresses is electrically connected to drain regions of the pair of write transistors in each of the plurality of memory cells M109, M309, M509 for odd addresses configured to store the odd addressed data associated with the column address "9" and the odd row address. The pair of write bit lines WBO11a, WBO10b for odd addresses is electrically connected to drain regions of the pair of write transistors in each of the plurality of memory cells M110, M310, M510 for odd addresses configured to store the odd addressed data associated with the column address "10" and the odd row address. The pair of write bit lines WBO24a, WBO24b for odd addresses is electrically connected to drain regions of the pair of write transistors in each of the plurality of memory cells M124, M324, M524 for odd addresses configured to store the odd addressed data associated with the column address "24" and the odd row address.

The memory array 21 for odd addresses further includes a plurality of read bit lines RBO1a, RBO1b, RB09a, RBO9b, RBO10a, RBO1b, . . . RBO24a, RBO24b for odd addresses. The plurality of read bit lines RBO1a, RBO1b, . . . , RBO9a, RBO9b, RBO10a, RBO10b, . . . RBO24a, RBO24b for odd addresses are configured to transfer the odd addressed data to be read from each of the plurality of memory cells M101-M124, M301-M324, M501-M524 for odd addresses in the column direction, during the read operation. The plurality of read bit lines RBO1a, RBO1b, . . . , RBO9a, RBO9b, RB010a, RBO10b, . . . RBO24a, RBO24b for odd addresses are parallel with the column direction of the memory array 21 for odd addresses. The pair of read bit lines RBO1$a$, RBO1$b$ for odd addresses is electrically connected to drain regions of the pair of read transistors in each of the plurality of memory cells M101, M301, M501 for odd addresses configured to store the odd addressed data associated with the column address "1". The pair of read bit lines RBO9$a$, RBO9$b$ for odd addresses is electrically connected to drain regions of the pair of read transistors in each of the plurality of memory cells M109, M309, M509 for odd addresses configured to store the odd addressed data associated with the column address "9". The pair of read bit lines RBO10$a$, RBO10$b$ for odd addresses is electrically connected to drain regions of the pair of read transistors in each of the plurality of memory cells M110, M310, M510 for odd addresses configured to store the odd addressed data associated with the column address "10". The pair of read bit lines RBO24$a$, RBO24$b$ for odd addresses is electrically connected to drain regions of the pair of read transistors in each of the plurality of memory cells M124, M324, M524 for odd addresses configured to store the odd addressed data associated with the column address "24".

When the odd addressed data is written in each of the plurality of memory cells M101-M124, M301-M324, M501-M524 for odd addresses, a write decoder 61 for odd addresses, shown in FIG. 1, transfers an odd address signal for the write operation to each of the plurality of write word lines WW1, WW3, WW5 for odd addresses, shown in FIG. 2, to select the row address for the odd addressed data to be stored. When the odd addressed data is read from each of the plurality of memory cells M101-M124, M301-M324, M501-M524 for odd addresses, a read decoder 63 for odd addresses, shown in FIG. 1, transfers an odd address signal for the read operation to each of the plurality of read word lines RW1, RW3, RW5 for odd addresses, shown in FIG. 2, to select the row address for the odd addressed data to be read.

A write precharge circuit 41 for odd addresses, shown in FIG. 1, is configured to precharge the high level voltage to each of the plurality of write bit lines WBO1$a$, WBO1$b$, ..., WBO24$a$, WBO24$b$ for odd addresses, shown in FIG. 2. A write amplifier 31 for odd addresses, shown in FIG. 1, is configured to write the odd addressed data to each of the plurality of memory cells M101-M124, M301-M324, M501-M524 for odd addresses, shown in FIG. 2, through the plurality of write bit lines WBO1$a$, WBO1$b$, ..., WBO24$a$, WBO24$b$ for odd addresses. A read precharge circuit 43 for odd addresses, shown in FIG. 1, is configured to precharge the high level voltage to each of the plurality of read bit lines RBO1$a$, RBO1$b$, ..., RBO24$a$, RBO24$b$ for odd addresses, shown in FIG. 2. A read amplifier 51 for odd addresses, shown in FIG. 1, is configured to read the odd addressed data from each of the plurality of memory cells M101-M124, M301-M324, M501-M524 for odd addresses, shown in FIG. 2, through the plurality of read bit lines RBO1$a$, RBO1$b$, ..., RBO24$a$, RBO24$b$ for odd addresses.

Figure 3:
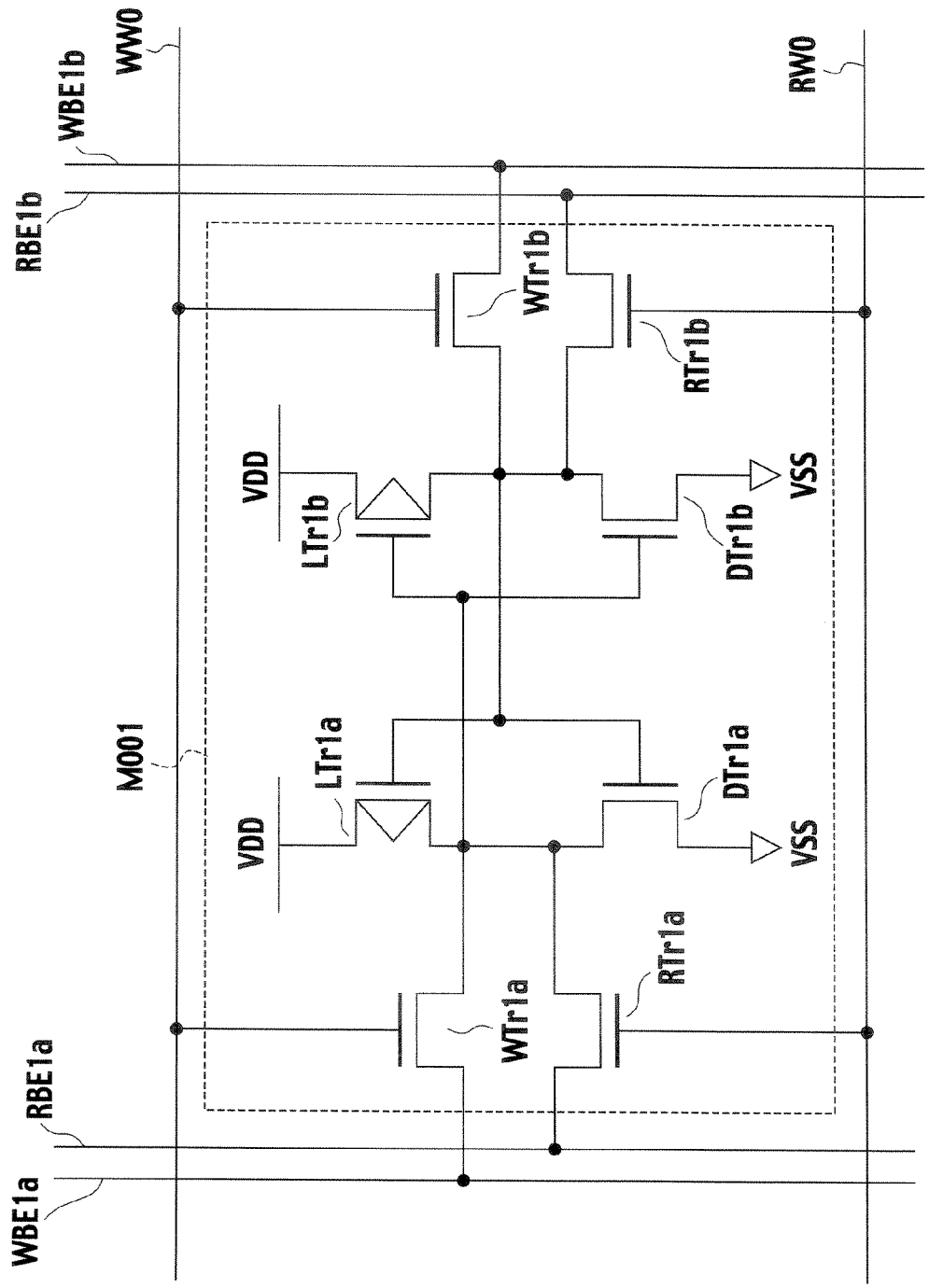
FIG. 3 is a circuit diagram of a memory cell of the semiconductor memory in accordance with the first embodiment of the present invention.

The memory cell M001 for even address is the one read and one write SRAM cell. With reference to FIG. 3, the memory cell M001 for even address includes the write transistor WTr1$a$ of which the drain region is electrically connected to the write bit line WBE1$a$ for even addresses, a load element LTr1$a$ of which drain region is electrically connected to a source region of the write transistor WTr1$a$, and a drive transistor DTr1$a$ of which drain region is electrically connected to the source region of the write transistor WTr1$a$. The memory cell M001 for even address further includes the write transistor WTr1$b$ of which the drain region is electrically connected to the write bit line WBE1$b$ for even addresses, a load element LTr1$b$ of which drain region is electrically connected to a source region of the write transistor WTr1$b$, and a drive transistor DTr1$b$ of which drain region is electrically connected to the source region of the write transistor WTr1$b$. Also, the memory cell M001 for even address includes the read transistor RTr1$a$ of which the drain region is electrically connected to the read bit line RBE1$a$ for even addresses and a source region is electrically connected to the source region of the write transistor WTr1$a$, the read transistor RTr1$b$ of which the drain region is electrically connected to the read bit line RBE1$b$ for even addresses and a source region is electrically connected to the source region of the write transistor WTr1$b$. The write transistors WTr1$a$, WTr1$b$, the read transistors RTr1$a$, RTr1$b$, and the drive transistors DTr1$a$, DTr1$b$ are nMOS transistors. The load elements LTr1$a$, LTr1$b$ are pMOS transistors. Those of ordinary skilled in the art will appreciate that the drain and the source can be exchanged in each of the write transistors WTr1$a$, WTr1$b$.

Each source region of the load elements LTr1$a$, LTr1$b$ is electrically connected to a high level voltage supply VDD. Each source region of the drive transistors DTr1$a$, DTr1$b$ is electrically connected to a low level voltage supply VSS. A gate of the load element LTr1$a$ and a gate of the drive transistor DTr1$a$ are electrically connected to each other to serve as an input of CMOS inverter. Also, a gate of the load element LTr1$b$ and a gate of the drive transistor DTr1$b$ are electrically connected to each other to serve as the input of the CMOS inverter.

An output of the CMOS inverter having the load element LTr1$a$ and the drive transistor DTr1$a$ is electrically connected to the source region of the write transistors WTr1$b$ and transmits a feedback signal to the input of the CMOS inverter having the load element LTr1$b$ and the drive transistor DTr1$b$. Also, an output of the CMOS inverter having the load element LTr1$b$ and the drive transistor DTr1$b$ is electrically connected to the source region of the write transistor WTr1$a$ and transmits the feedback signal to the input of the CMOS inverter having the load element LTr1$a$ and the drive transistor DTr1$a$.

Each gate of the write transistors WTr1$a$, WTr1$b$ is electrically connected to the write word line WW0 for even addresses. Each gate of the read transistors RTr1$a$, RTr1$b$ is electrically connected to the read word line RW0 for even addresses. Each of the memory cells M002-M024, M201-M224, M401-M424 for even addresses and the memory cells M101-M124, M301-M324, M501-M524 for odd addresses is also the one read and one write SRAM cell and similar to FIG. 3.

Next, first example of the write operation of the semiconductor memory, according to the first embodiment, shown in FIGS. 1-3, is described. Here, the start row address for sequential data to be written in the semiconductor memory is "2". The start column address for the sequential data to be written in the semiconductor memory is "10". The end row address for the sequential data to be written in the semiconductor memory is "3". The end column address for the sequential data to be written in the semiconductor memory is "9". Therefore, the sequential data are written in the semiconductor memory over two rows.

The write amplifier 30 for even addresses, shown in FIG. 1, supplies a high level voltage signal to the plurality of write bit lines WBE10$a$-WBE24$a$ for even addresses, shown in FIG. 2, and a low level voltage signal to another plurality of write bit lines WBE10$b$-WBE24$b$ for even addresses. Further, the write decoder 60 for even addresses, shown in FIG. 1, applies the high level voltage as the even address signal for the write operation to the write word line WW2 for even addresses, shown in FIG. 2. Consequently, the states of write transistors WTr1*a*, WTr1*b*, shown in FIG. 3, within each of the plurality of memory cells M201-M224 for even addresses go from an off state to an on state.

Since the write transistors WTr1*a*, WTr1*b* are in the on state, the high level voltage signal as the even addressed data associated with the row address "2" and the column address "10" is written in a node of the write transistor WTr1*a* within the memory cell M210 for even address. The plurality of even addressed data associated with the row address "2" and corresponding column addresses are also written in the plurality of memory cells M211-M224 for even addresses, respectively.

Further, the write amplifier 31 for odd addresses, shown in FIG. 1, supplies the high level voltage signal to the plurality of write bit lines write bit lines WBO1*a*-WBO9*a* for odd addresses, shown in FIG. 2, and the low level voltage signal to another plurality of write bit lines WBO1*b*-WBO9*b* for odd addresses. Further, the write decoder 61 for odd addresses, shown in FIG. 1, applies the high level voltage as the odd address signal for the write operation to the write word line WW3 for odd addresses, shown in FIG. 2. Consequently, the states of write transistors WTr1*a*, WTr1*b*, shown in FIG. 3, within the plurality of memory cells M301-M324 for odd addresses go from the off state to the on state.

Since the write transistors WTr1*a*, WTr1*b* are in the on state, the odd addressed data associated with the row address "3" and the column address "1" is written in a node of the write transistors WTr1*a* within the memory cell M301 for odd address. The plurality of odd addressed data associated with the row address "3" and corresponding column addresses are written in the plurality of memory cells M302-M308 for odd address, respectively. Also, the odd addressed data associated with the end row address "3" and the end column address "9" is written in a node of the write transistor WTr1*a* within the memory cell M309 for odd address and the write operation of the sequential data is completed.

Next, second example of the write operation of the semiconductor memory, according to the first embodiment, shown in FIGS. 1-3, is described. Here, the start row address for sequential data to be written in the semiconductor memory is "1". The start column address for the sequential data to be written in the semiconductor memory is "10". The end row address for the sequential data to be written in the semiconductor memory is "2". The end column address for the sequential data to be written in the semiconductor memory is "9". Therefore, the sequential data are written in the semiconductor memory over two rows.

The write amplifier 31 for odd addresses, shown in FIG. 1, supplies the high level voltage signal to the plurality of write bit lines WBO10*a*-WBO24*a* for odd addresses, shown in FIG. 2, and the low level voltage signal to another plurality of write bit lines WBO10*b*-WBO24*b* for odd addresses. Further, the write decoder 61 for odd addresses, shown in FIG. 1, applies the high level voltage as the odd address signal for the write operation to the write word line WW1 for odd addresses, shown in FIG. 2. Consequently, the states of write transistors WTr1*a*, WTr1*b*, shown in FIG. 3, within each of the plurality of memory cells M101-M124 for odd addresses go from an off state to an on state.

Since the write transistors WTr1*a*, WTr1*b* are in the on state, the odd addressed data associated with the row address "1" and the column address "10" is written in a node of the write transistor WTr1*a* within the memory cell M110 for odd address. The plurality of odd addressed data associated with the row address "1" and corresponding column addresses are also written in the plurality of memory cells M111-M124 for odd address, respectively.

Also, the write amplifier 30 for even addresses, shown in FIG. 1, supplies the high level voltage signal to the plurality of write bit lines WBE1*a*-WBE9*a* for even addresses, shown in FIG. 2, and the low level voltage signal to another plurality of write bit lines WBE1*b*-WBE9*b* for even addresses. Further, the write decoder 60 for even addresses, shown in FIG. 1, applies the high level voltage as the even address signal for the write operation to the write word line WW2 for even addresses, shown in FIG. 2. Consequently, the states of write transistors WTr1*a*, WTr1*b*, shown in FIG. 3, within the plurality of memory cells M201-M224 for even addresses go from the off state to the on state.

Since the write transistors WTr1*a*, WTr1*b* are in the on state, the even addressed data associated with the row address "2" and the column address "1" is written in a node of the write transistor WTr1*a* within the memory cell M201 for even address. The plurality of even addressed data associated with the row address "2" and corresponding column addresses are also written in the plurality of memory cells M202-M208 for even addresses, respectively. Also, the even addressed data associated with the end row address "2" and the end column address "9" is written in a node of the write transistor WTr1*a* within the memory cell M209 for even address and the write operation of the sequential data is completed.

Next, an example of the read operation of the semiconductor memory, according to the first embodiment, shown in FIGS. 1-3, is described. Here, the start row address for sequential data to be read from the semiconductor memory is "2". The start column address for the sequential data to be read from the semiconductor memory is "10". The end row address for the sequential data to be read from the semiconductor memory is "3". The end column address for the sequential data to be read from the semiconductor memory is "9". Therefore, the sequential data are read from the semiconductor memory over two rows.

The read precharge circuit 42 for even addresses, shown in FIG. 1, supplies the high level voltage to the plurality of read bit lines RBE10*a*-RBE24*a* for even addresses, shown in FIG. 2. And the read decoder 62 for even addresses, shown in FIG. 1, applies the high level voltage as the even address signal for the read operation to the read word line RW2 for even addresses, shown in FIG. 2. Consequently, the states of read transistors RTr1*a*, RTr1*b*, shown in FIG. 3, within each of the plurality of memory cells M201-M224 for even addresses go from the off state to the on state.

When the high level voltage signal corresponding to the even addressed data associated with the row address "2" and the column address "10" is stored in the node of the read transistor RTr1*a* within the memory cell M210 for even address, the voltage on the read bit line RBE10*a* for even addresses remains high after the read transistor RTr1*a* goes from the off state to the on state. The read amplifier 50 for even addresses reads the even addressed data associated with the row address "2" and the column address "10" stored in the memory cell M210 for even address, based on the voltage on the read bit line RBE10*a* for even addresses. Also, the read amplifier 50 for even addresses reads the even addressed data stored in each of the plurality of memory cells M211-M224 for even addresses.

The read precharge circuit 43 for odd addresses, shown in FIG. 1, precharges the high level voltage to the plurality of read bit lines RBO1*a*-RBO9*a* for odd addresses, shown in FIG. 2. Further, the read decoder 63 for odd addresses, shown in FIG. 1, applies the high level voltage as the odd address signal for the read operation to the read word line RW3 for odd addresses, shown in FIG. 2. Consequently, the states of read transistors RTr1*a*, RTr1*b*, shown in FIG. 3, within each of the plurality of memory cells M301-M324 for odd addresses go from the off state to the on state.

When the high level voltage signal corresponding to the odd addressed data associated with the row address "3" and the column address "1" is stored in the node of the read transistor RTr1a within the memory cell M301 for odd address, the voltage on the read bit line RBO1a for odd addresses remains high after the read transistor RTr1a goes from the off state to the on state. The read amplifier 51 for odd addresses reads the odd addressed data associated with the row address "3" and the column address "1" stored in the memory cell M301 for odd address, based on the voltage on the read bit line RBO1a for odd addresses. The read amplifier 51 for odd addresses also reads the odd addressed data stored in each of the plurality of memory cells M302-M309 for odd addresses and the read operation of the sequential data is completed.

Figure 4:
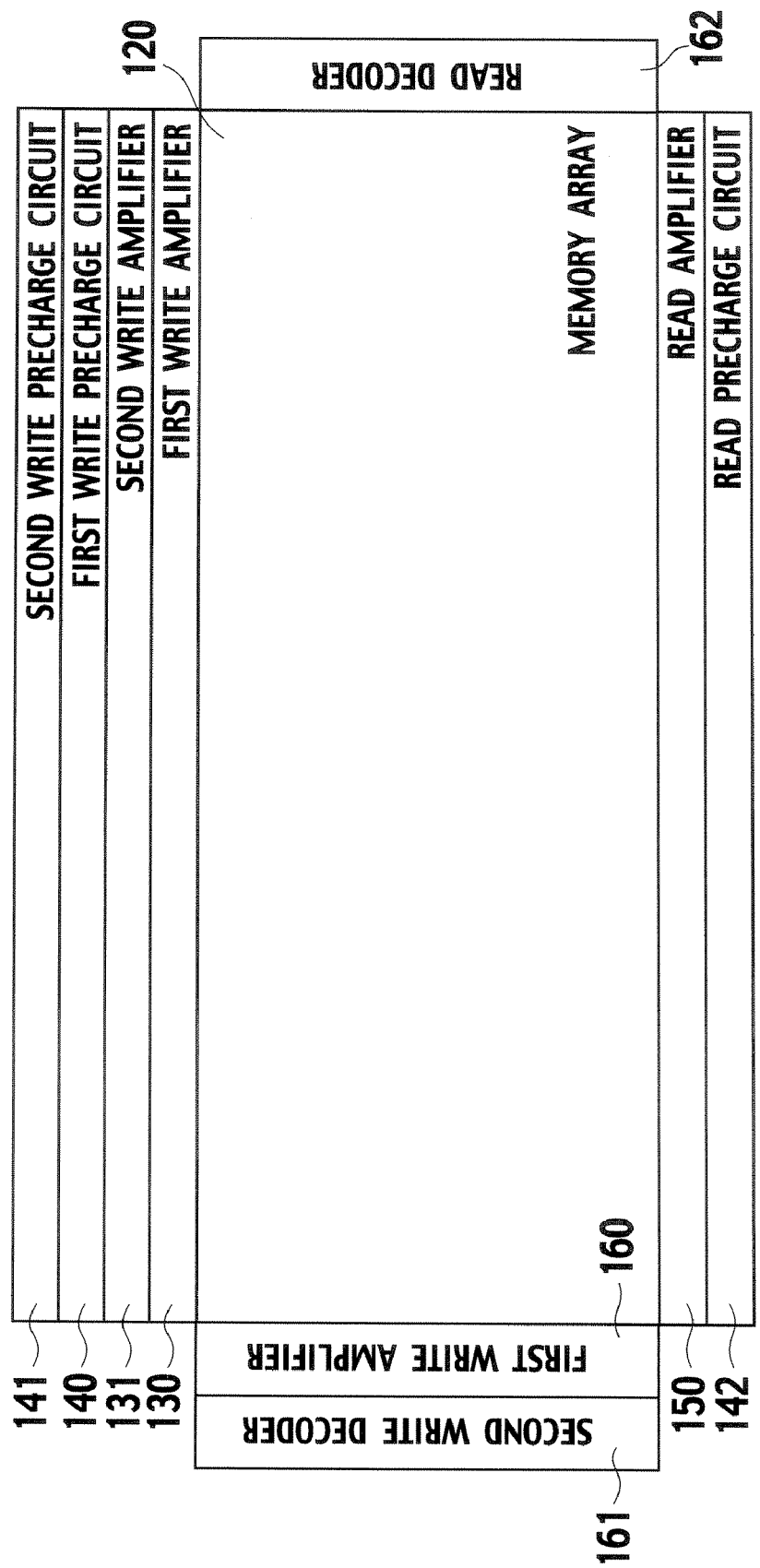
FIG. 4 is a diagram of a semiconductor memory according to a comparative example.
Figure 5:
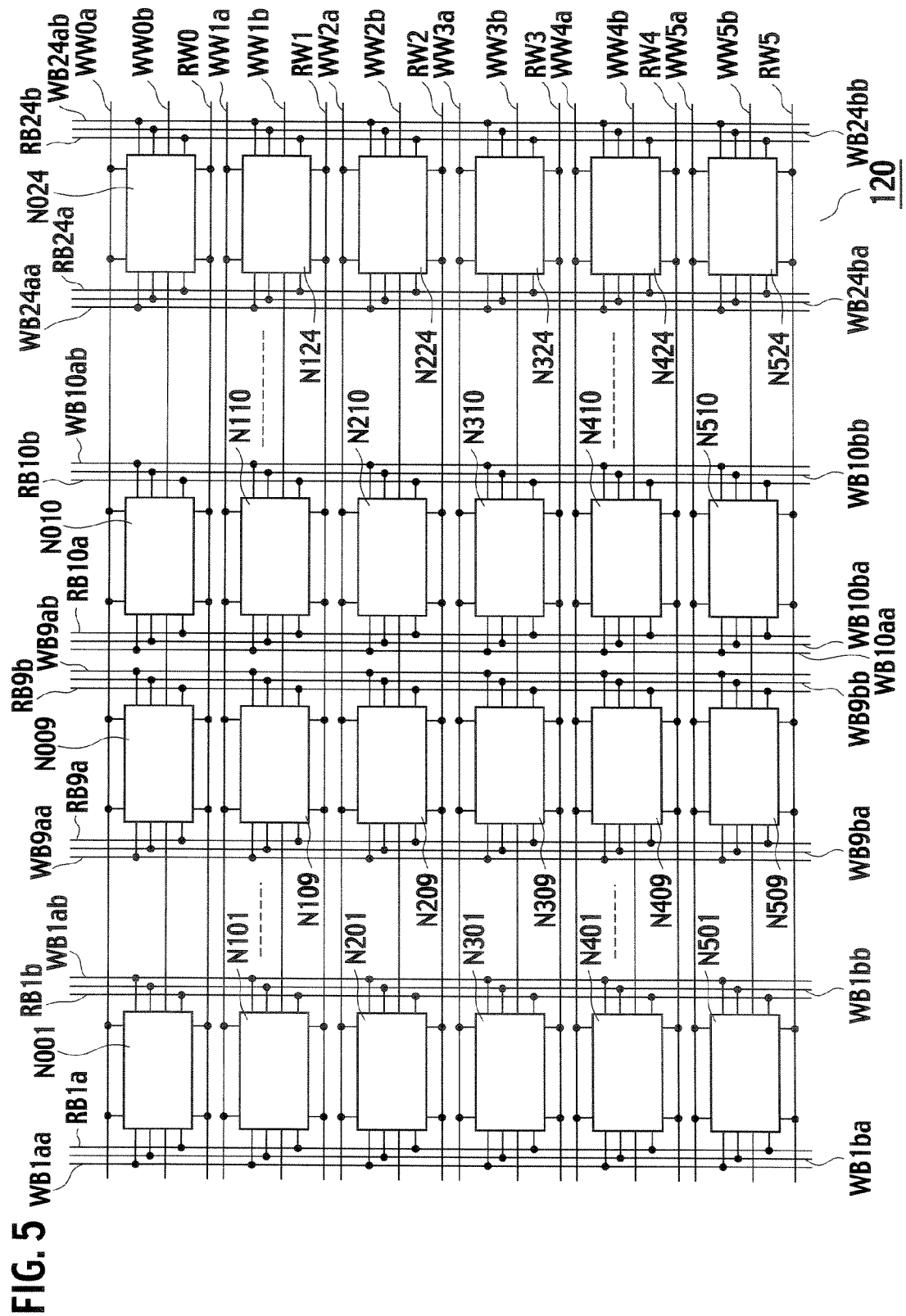
FIG. 5 is a circuit diagram of a memory array of the semiconductor memory according to the comparative example.

With reference next to FIG. 4, a semiconductor memory, according to a comparative example, includes a memory array 120. As shown in FIG. 5, the memory array 120 includes a plurality of memory cells N001, ..., N009, N010, ..., N024 configured to store data associated with the row address "0". A plurality of memory cells N101, ..., N109, N110, ..., N124 are configured to store data associated with the row address "1". A plurality of memory cells N201, ..., N209, N210, ..., N224 are configured to store data associated with the row address "2". A plurality of memory cells N301, ..., N309, N310, ..., N324 are configured to store data associated with the row address "3". A plurality of memory cells N401, ..., N409, N410, ..., N424 are configured to store data associated with the row address "4". A plurality of memory cells N501, ..., N509, N510, ..., N524 are configured to store data associated with the row address "5".

The plurality of memory cells N001, ..., N009, N010, ..., N024 are parallel with a row direction of the memory array 120. The plurality of memory cells N101, ..., N109, N110, ..., N124 are parallel with the plurality of memory cells N001, ..., N009, N010, ..., N024. The plurality of memory cells N201, ..., N209, N210, ..., N224 are parallel with the plurality of memory cells N101, ..., N109, N110, ..., N124. The plurality of memory cells N301, ..., N309, N310, ..., N324 are parallel with the plurality of memory cells N201, ..., N209, N210, ..., N224. The plurality of memory cells N401, ..., N409, N410, ..., N424 are parallel with the plurality of memory cells N301, ..., N309, N310, ..., N324. The plurality of memory cells N501, ..., N509, N510, ..., N524 are parallel with the plurality of memory cells N401, ..., N409, N410, ..., N424.

The memory array further includes a plurality of first write word lines WW0a, WW1a, WW2a, WW3a, WW4a, WW5a and a plurality of second write word lines WW0b, WW1b, WW2b, WW3b, WW4b, WW5b. The plurality of first write word lines WW0a-WW5a are configured to transfer a first address signal for the write operation to select the plurality of memory cells N001-N024, N101-N124, N201-N224, N301-N324, N401-N424, N501-N524, during the write operation. The plurality of second write word lines WW0b-WW5b are configured to transfer a second address signal for the write operation. The plurality of first write word lines WW0a, WW1a, WW2a, WW3a, WW4a, WW5a and the plurality of second write word lines WW0b, WW1b, WW2b, WW3b, WW4b, WW5b are parallel with the row direction of the memory array 120.

Specifically, the first write word line WW0a is electrically connected to gates of a pair of first write transistors in each of the plurality of memory cells N001, ..., N009, N010, ..., N024, as described bellow. The second write word line WW0b is electrically connected to gates of a pair of second write transistors in each of the plurality of memory cells N001, ..., N009, N010, ..., N024, as described bellow. The first write word line WW1a is electrically connected to gates of a pair of first write transistors in each of the plurality of memory cells N101, ..., N109, N110, ..., N124. The second write word line WW1b is electrically connected to gates of a pair of second write transistors in each of the plurality of memory cells N101, ..., N109, N110, ..., N124 The first write word line WW2a is electrically connected to gates of a pair of first write transistors in each of the plurality of memory cells N201, ..., N209, N210, ..., N224. The second write word line WW2b is electrically connected to gates of a pair of second write transistors in each of the plurality of memory cells N201, ..., N209, N210, ..., N224. The first write word line WW3a is electrically connected to gates of a pair of first transistors in each of the plurality of memory cells N301, ..., N309, N310, ..., N324. The second write word line WW3b is electrically connected to gates of a pair of second write transistors in each of the plurality of memory cells N301, ..., N309, N310, ..., N324. The first write word line WW4a is electrically connected to gates of a pair of first write transistors in each of the plurality of memory cells N401, ..., N409, N410, ..., N424. The second write word line WW4b is electrically connected to gates of a pair of second write transistors in each of the plurality of memory cells N401, ..., N409, N410, ..., N424. The first write word line WW5a is electrically connected to gates of a pair of first write transistors in each of the plurality of memory cells N501, ..., N509, N510, ..., N524 The second write word line WW5b is electrically connected to gates of a pair of second write transistors in each of the plurality of memory cells N501, ..., N509, N510, ..., N524.

Also, the memory array 120 includes a plurality of read word lines RW0, RW1, RW2, RW3, RW4, RW5 configured to transfer an address signal for the read operation to select the plurality of memory cells N001-N024, N101-N124, N201-N224, N301-N324, N401-N424, N501-N524, during the read operation. The plurality of read word lines RW0, RW1, RW2, RW3, RW4, RW5 are parallel with the row direction of the memory array 120. The read word line RW0 is electrically connected to gates of a pair of read transistors in each of the plurality of memory cells N001, ..., N009, N010, ..., N024, as described below. The read word line RW1 is electrically connected to gates of a pair of read transistors in each of the plurality of memory cells N101, ..., N109, N110, ..., N124. The read word line RW2 is electrically connected to gates of a pair of read transistors in each of the plurality of memory cells N201, ..., N209, N210, ..., N224. The read word line RW3 is electrically connected to gates of a pair of read transistors in each of the plurality of memory cells N301, ..., N309, N310, ..., N324. The read word line RW4 is electrically connected to gates of a pair of read transistors in each of the plurality of memory cells N401, ..., N409, N410, ..., N424. The read word line RW5 is electrically connected to gates of a pair of read transistors in each of the plurality of memory cells N501, ..., N509, N510, ..., N524.

The memory array 120 further includes a plurality of write bit lines WB1aa, WB1ab, ..., WB9aa, WB9ab, WB10aa, WB10ab, ... WB24aa, WB24ab configured to transfer the data to each of the plurality of memory cells N001-N024, N101-N124, N201-N224, N301-N324, N401-N424, N501-N524, during the write operation. The plurality of write bit lines WB1aa, WB1ab, ..., WB9aa, WB9ab, WB10aa, WB10ab, ... WB24aa, WB24ab are arranged parallel with a column direction of the memory array 120. The pair of first write bit lines WB1aa, WB1ab is electrically connected to drain regions of the pair of first write transistors, respectively, in each of the plurality of memory cells N001, N101, N201, N301, N401, N501 configured to store the data associated with the column address "1". The pair of first bit lines WB9aa, WB9ab is electrically connected to drain regions of the pair of first write transistors, respectively, in each of the plurality of memory cells N009, N109, N209, N309, N409, N509 configured to store the data associated with the column address "9". The pair of first bit lines WB10aa, WB10ab is electrically connected to drain regions of the pair of first write transistors, respectively, in each of the plurality of memory cells N010, N110, N210, N310, N410, N510 configured to store the data associated with the column address "10". The pair of first bit lines WB24aa, WB24ab is electrically connected to drain regions of the pair of first write transistors, respectively, in each of the plurality of memory cells N024, N124, N224, N324, N424, N524 configured to store the data associated with the column address "24".

The memory array 120 further includes a plurality of second write bit lines WB1ba, WB1bb, ..., WB9ba, WB9bb, WB10ba, WB10bb, ... WB24ba, WB24bb configured to transfer the data to each of the plurality of memory cells N001-N024, N101-N124, N201-N224, N301-N324, N401-N424, N501-N524, during the write operation. The plurality of second write bit lines WB1ba, WB1bb, ..., WB9ba, WB9bb, WB10ba, WB10bb, ... WB24ba, WB24bb are arranged parallel with the column direction of the memory array 120. The pair of second write bit lines WB1ba, WB1bb is electrically connected to drain regions of the pair of second write transistors, respectively, in each of the memory cells N001, N101, N201, N301, N401, N501 configured to store the data associated with the column address "1" The pair of second write bit lines WB9ba, WB9bb is electrically connected to drain regions of the pair of second write transistors, respectively, in each of the memory cells N009, N109, N209, N309, N409, N509 configured to store the data associated with the column address "9". The pair of second write bit lines WB10ba, WB10bb is electrically connected to drain regions of the pair of second write transistors, respectively, in each of the memory cells N010, N110, N210, N310, N410, N510 configured to store the data associated with the column address "10". The pair of second write bit lines WB24ba, WB24bb is electrically connected to drain regions of the pair of second write transistors, respectively, in each of the memory cells N024, N124, N224, N324, N424, N524 configured to store the data associated with the column address "24".

The memory array 120 further includes a plurality of read bit lines RB1a, RB1b, ..., RB9a, RB9b, RB10a, RB10b, ... RB1a, RB10b configured to transfer the data to be read from the plurality of memory cells N001-N024, N101-N124, N201-N224, N301-N324, N401-N424, N501-N524, during the read operation. The plurality of read bit lines RB1a, RB1b, ..., RB9a, RB9b, RB10a, RB1b, ... RB10a, RB10b are parallel with the column direction of the memory array 120. The pair of read bit lines RB1a, RB1b is electrically connected to drain regions of the pair of read transistors, respectively, in each of the plurality of memory cells N001, N101, N201, N301, N401, N501 configured to store the data associated with the column address "1". The pair of read bit lines RB9a, RB9b is electrically connected to drain regions of the pair of read transistors, respectively, in each of the plurality of memory cells N009, N109, N209, N309, N409, N509 configured to store the data associated with the column address "9". The pair of read bit lines RB10a, RB10b is electrically connected to drain regions of the pair of read transistors, respectively, in each of the plurality of memory cells N010, N110, N210, N310, N410, N510 configured to store the data associated with the column address "10". The pair of read bit lines RB24a, RB24b is electrically connected to drain regions of the pair of read transistors, respectively, in each of the plurality of memory cells N024, N124, N224, N324, N424, N524 configured to store the data associated with the column address "24".

Figure 6:
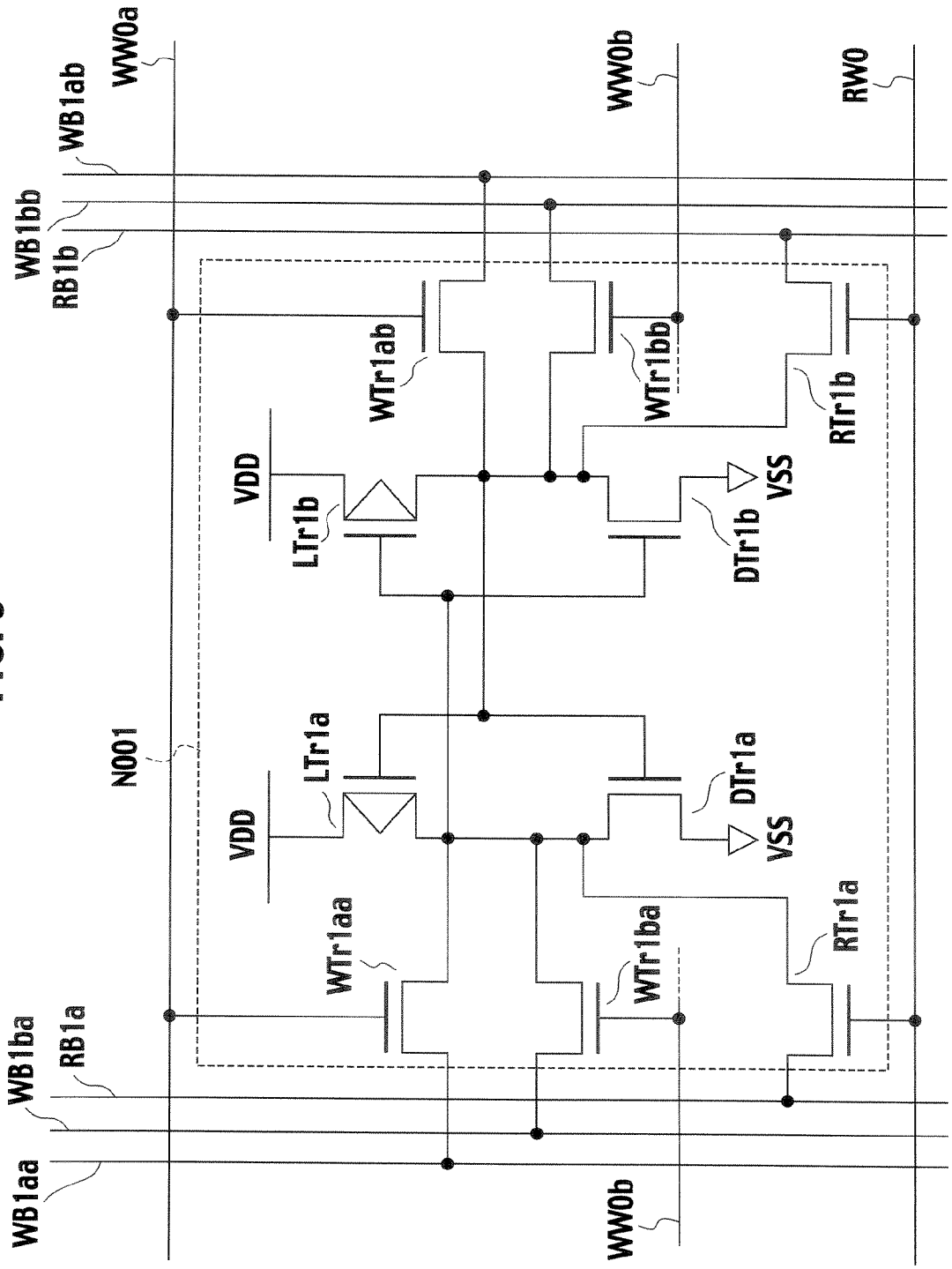
FIG. 6 is a circuit diagram of a memory cell of the semiconductor memory according to the comparative example.

The memory cell N001, shown in FIG. 5, is the one read and two write SRAM cell. With reference to FIG. 6, the memory cell N001 includes the first write transistor WTr1aa of which the drain region is electrically connected to the first write bit line WB1aa, and another first write transistor WTr1ab of which the drain region is electrically connected to another first write bit line WB1ab. Each gate of the first write transistor WTr1aa, WTr1ab is electrically connected to the first write word line WW0a. Also, the memory cell N001 includes the second write transistor WTr1ba of which the drain region is electrically connected to the second write bit line WB1ba, and another second write transistor WTr1bb of which the drain region is electrically connected to another second write bit line WB1bb. Each gate of the second write transistors WTr1ba, WTr1bb is electrically connected to the second write word line WW0b. Further, the memory cell N001 includes the read transistor RTr1a of which the drain region is electrically connected to the read bit line RB1a, and another read transistor RTr1b of which the drain region is electrically connected to another read bit line RB1b. Each gate of the read transistors RTr1a, RTr1b is electrically connected to the read word line RW0.

The first write transistors WTr1aa, WTr1ab, the second write transistors WTr1ba, WTr1bb, and the read transistors RTr1a, RTr1b are nMOS transistors. The memory cell N001 further includes CMOS inverters having load elements LTr1a, LTr1b and drive transistors DTr1a, DTr1b, respectively, similar to the memory cell M001 for even address shown in FIG. 3. Each of the plurality of memory cells N009-N524, shown in FIG. 5 is also the one read and two write SRAM cell and similar to FIG. 6.

With reference to FIG. 4, a first write decoder 160 is configured to transfer the first address signal for the write operation to each of the plurality of first write word lines WW0a-WW5a, shown in FIG. 5, to select the row address for the data, when the data is written in each of the plurality of memory cells N001-N024, N101-N124, N201-N224, N301-N324, N401-N424, N501-N524. A second write decoder 161, shown in FIG. 4, is configured to transfer the second address signal for the write operation to each of the plurality of second write word lines WW0b-WW5b, shown in FIG. 5, to select the row address for the data, when the data is written in the plurality of memory cells N001-N024, N101-N124, N201-N224, N301-N324, N401-N424, N501-N524. A read decoder 162, shown in FIG. 4, is configured to transfer the address signal for the read operation to each of the plurality of read word lines RW0-RW5, shown in FIG. 5, to select the row address for the data, when the data is read from each of the plurality of memory cells N001-N024, N101-N124, N201-N224, N301-N324, N401-N424, N501-N524.

With reference to FIG. 4, a first write precharge circuit 140 is configured to precharge the high level voltage to each of the plurality of first write bit lines WB1aa, WB1ab, ..., WB24aa, WB24ab, shown in FIG. 5. A second write precharge circuit 141, shown in FIG. 4, is configured to precharge the high level voltage to each of the plurality of second write bit lines WB1ba, WB1bb, ..., WB24ba, WB24bb, shown in FIG. 5. A first write amplifier 130, shown in FIG. 4, is configured to write the data to each of the plurality of memory cells N001-N024, N101-N124, N201-N224, N301-

N324, N401-N424, N501-N524, shown in FIG. 5, through the plurality of first write bit lines WB1*aa*, WB1*ab*, WB24*aa*, WB24*ab*. A second write amplifier 131, shown in FIG. 4, is configured to write the data to each of the plurality of memory cells N001-N024, N101-N124, N201-N224, N301-N324, N401-N424, N501-N524, shown in FIG. 5, through the plurality of second write bit lines WB1*ba*, WB1*bb*, . . . , WB24*ba*, WB24*bb*. A read precharge circuit 142, shown in FIG. 4, is configured to precharge the high level voltage to each of the plurality of read bit lines RB1*a*, RB1*b*, . . . , RB1*a*, RB10*b*, shown in FIG. 5. A read amplifier 150, shown in FIG. 4, is configured to read the data from each of the plurality of memory cells N001-N024, N101-N124, N201-N224, N301-N324, N401-N424, N501-N524, shown in FIG. 5, through the plurality of read bit lines RB1*a*, RB1*b*, . . . , RB10*a*, RB10*b*.

Next, an example of the write operation of the semiconductor memory, according to the comparative example, shown in FIGS. 4-6, is described. Here, the start row address for sequential data to be written in the semiconductor memory is "2". The start column address for the sequential data to be written in the semiconductor memory is "10". The end row address for the sequential data to be written in the semiconductor memory is "3". The end column address for the sequential data to be written in the semiconductor memory is "9". Therefore, the sequential data are written in the semiconductor memory, according to the comparative example, over two rows.

The first write amplifier 130 supplies the high level voltage signal to the plurality of first write bit lines WB10*aa*-WB24*aa*, shown in FIG. 5, and the low level voltage signal to another plurality of first write bit lines WB10*ab*-WB24*ab*. Further, the second write amplifier 131, shown in FIG. 4, supplies the high level voltage signal to the plurality of second write bit lines WB1*ba*-WB9*ba*, shown in FIG. 5, and the low level voltage signal to another plurality of second write bit lines WB1*bb*-WB9*bb*.

The first write decoder 160, shown in FIG. 4, applies the high level voltage to the first write word line WW2*a*, shown in FIG. 5. Consequently, the states of first write transistors WTr1*aa*, WTr1*ab*, shown in FIG. 6, within each of the plurality of memory cells N201-N224 go from the off state to the on state. Therefore, the high level voltage signal as the data associated with the row address "2" and the column address "10" is written in a node of the first write transistor WTr1*aa* within the memory cell N210, shown in FIG. 5. The plurality of data associated with the row address "2" and corresponding column addresses are also written in the plurality of memory cells N211-N224.

The second write decoder 161, shown in FIG. 4, applies the high level voltage to the second write word line WW3*b*, shown in FIG. 5. Consequently, the states of second write transistors WTr1*ba*, WTr1*bb*, shown in FIG. 6, within each of the plurality of memory cells N301-N324 go from the off state to the on state. Therefore, the high level voltage signal as the data associated with the row address "3" and the column address "1" is written in a node of the first write transistor WTr1*ba* within the memory cell N301, shown in FIG. 5. The plurality of data associated with the row address "3" and corresponding column addresses are also written in the plurality of memory cells N302-N308. Further, the data associated with the end row address "3" and the end column address "9" is written in a node of the second write transistor WTr1*ba* within the memory cell N309 and the write operation of the semiconductor memory, according to the comparative example, is completed.

In the comparative example, shown in FIG. 5, it is impossible to use the one read and one write SRAM cell for each of the plurality of memory cells N001-N524. For example, the plurality of memory cells N001, N101, N201, N301, N401, N501 configured to store the data associated with the column address "1" own the bit line jointly. Therefore, if the one read and one write SRAM cell is applied to the semiconductor memory according to the comparative example, the data to be written in the memory cell N301 is also written in the memory cell N201, unintentionally, in the above example of the write operation. Similar problems happen to the plurality of memory cells N202-N209.

However, the semiconductor memory, according to the first embodiment, shown in FIGS. 1-3, writes the even addressed data associated with the even row addresses in the plurality of memory cells M001-M024, M201-M224, M401-M424 for even addresses, through the plurality of write bit lines WBE1*a*, WBE1*b*, WBE24*a*, WBE24*b* for even addresses. Also, the semiconductor memory, according to the first embodiment, writes the odd addressed data associated with the odd row addresses in the plurality of memory cells M101-M124, M301-M324, M501-M524 for odd addresses, through the plurality of write bit lines WBO1*a*, WBO1*b*, . . . , WBO24*a*, WBO24*b* that are independent from the plurality of write bit lines WBE1*a*, WBE1*b*, . . . , WBE24*a*, WBE24*b* for even addresses. Therefore, even though the semiconductor memory, according to the first embodiment, uses the plurality of one read and one write SRAM cells, the semiconductor memory writes the sequential data over the plurality of rows, correctly. Accordingly, unintentional writing operation as described above does not happen. Also, the semiconductor memory reads the sequential data over the plurality of rows, correctly.

Further, the area of the one read and one write SRAM cell is smaller than the area of the one read and two write SRAM cell, since the one read and one write SRAM cell includes fewer transistors than the one read and two write SRAM cell. Therefore, the first embodiment makes it possible to reduce the area of the semiconductor memory. Also, manufacturing the one read and one write SRAM cell is easier than manufacturing the one read and two write SRAM cell. Accordingly, the first embodiment makes it possible to increase the yield rate when the semiconductor memory is manufactured.

Second Embodiment

Figure 7:
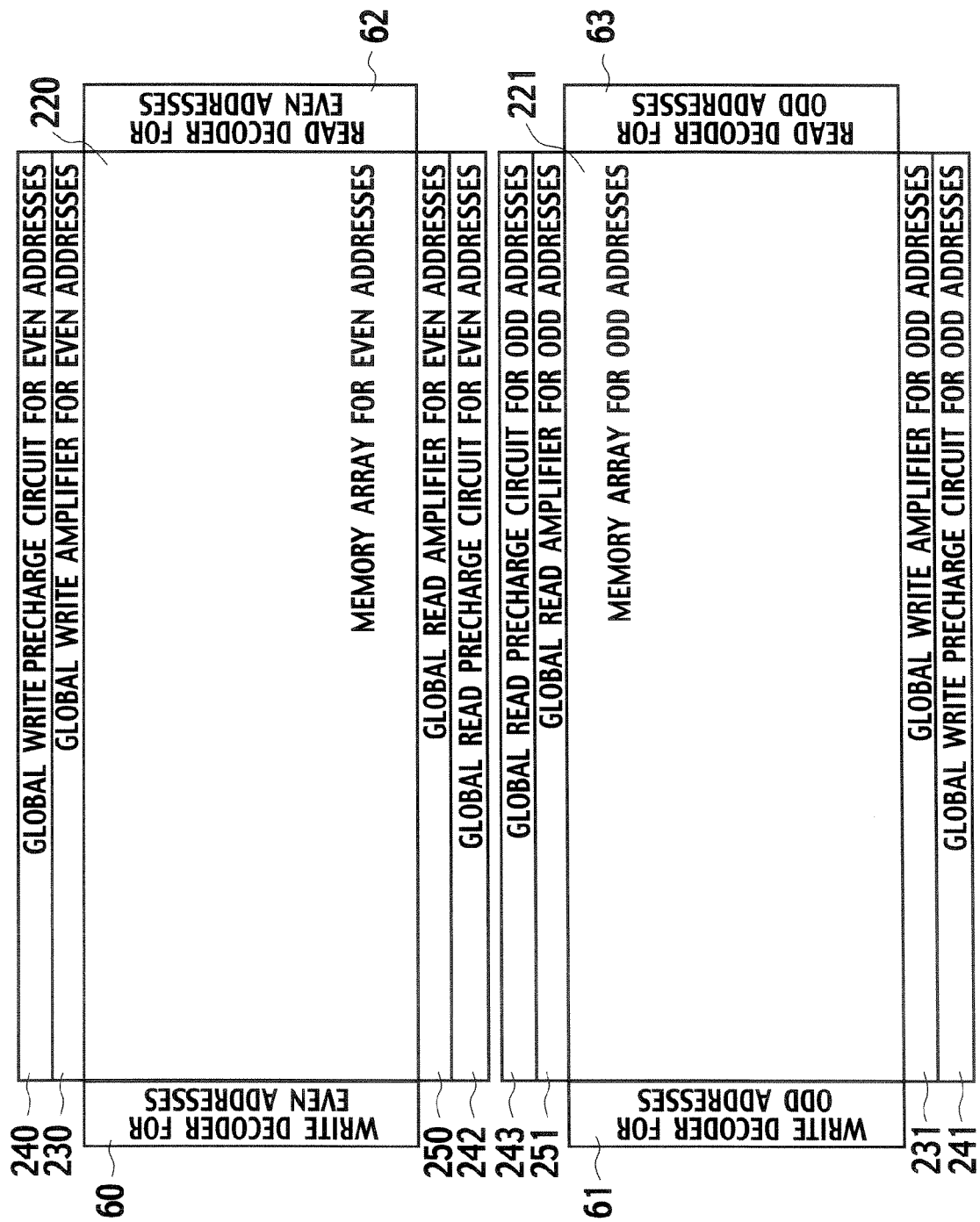
FIG. 7 is a diagram of the semiconductor memory in accordance with a second embodiment of the present invention.
Figure 8:
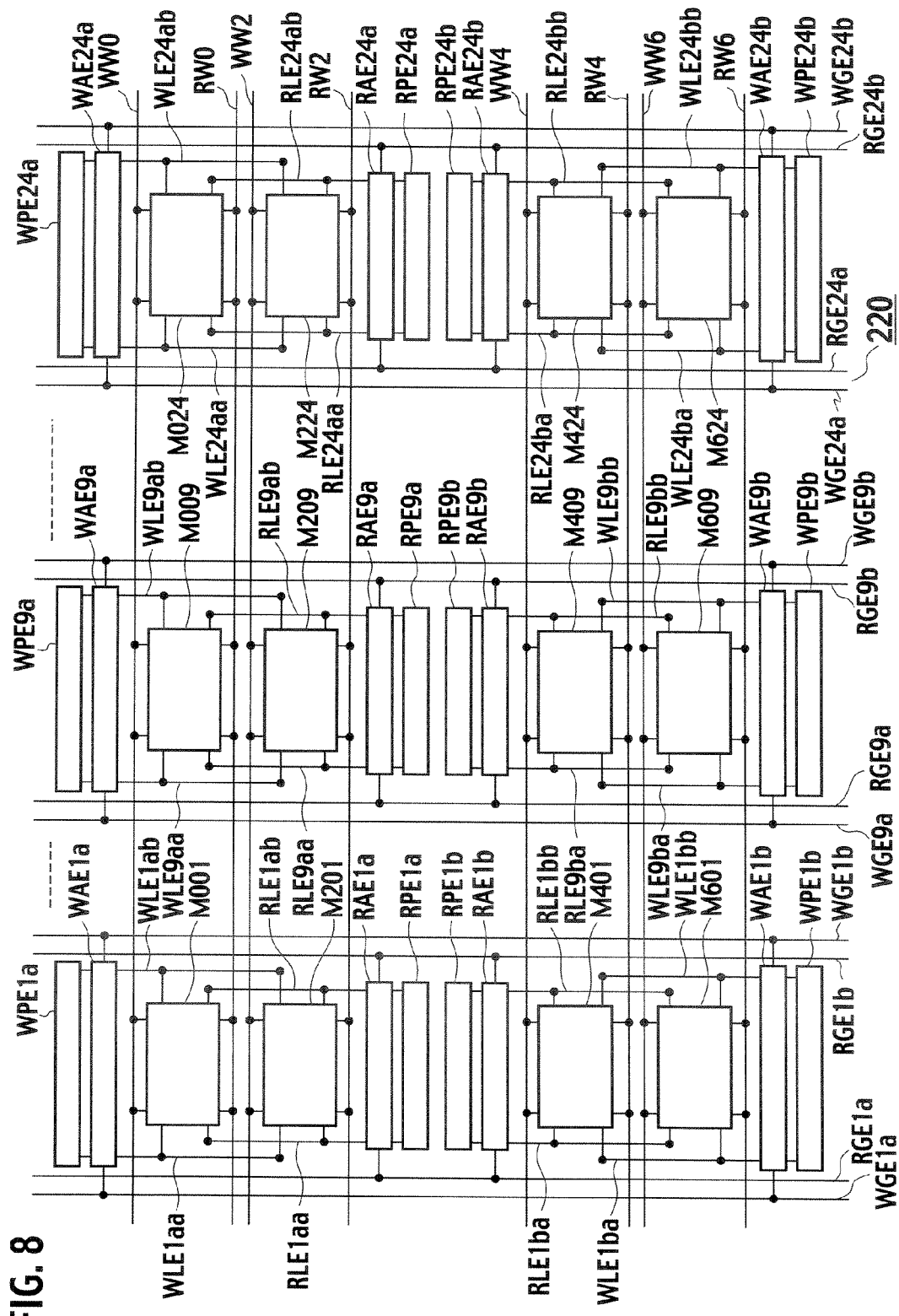
FIG. 8 is a first circuit diagram of a memory array of the semiconductor memory in accordance with the second embodiment of the present invention.

With reference to FIG. 7, the semiconductor memory, according to the second embodiment, also includes the memory array 220 for even addresses and the memory array 221 for odd addresses. With reference to FIG. 8, the memory array 220 for even addresses, according to the second embodiment, includes the plurality of memory cells M001-M024, M201-M224, M401-M424, M601-M624 for even addresses arranged in an array of four rows and 24 columns. Each of the plurality of memory cells M001-M024, M201-M224, M401-M424, M601-M624 is the one read and one write SRAM cell, as shown in FIG. 3. As shown in FIG. 8, the semiconductor memory, according to the second embodiment, has hierarchical bit line architecture. Specifically, the memory array 220 for even addresses includes a pair of global write bit lines WGE1*a*, WGE1*b* for even addresses. A local write amplifier WAE1*a* for even addresses is connected to the global write bit lines WGE1*a*, WGE1*b* for even addresses. A pair of local write bit lines WLE1*aa*, WLE1*ab* for even addresses is connected to the local write amplifier WAE1*a* for even addresses. The local write amplifier WAE1*a* for even addresses is configured to supply the voltage to each of the local write bit lines WLE1aa, WLE1ab, based on the voltage on the global write bit lines WGE1a, WGE1b for even addresses. The local write bit lines WLE1aa, WLE1ab for even addresses are connected to the write transistors WTr1a, WTr1b within the memory cells M001, M201 for even addresses, respectively. Also, the local write bit lines WLE1aa, WLE1ab for even addresses are connected to a local write precharge circuit WPE1a for even addresses. The local write precharge circuit WPE1a for even addresses is configured to precharge the high level voltage to the local write bit lines WLE1aa, WLE1ab for even addresses.

Also, the memory array 220 for even addresses includes a pair of global read bit lines RGE1a, RGE1b for even addresses. A local read amplifier RAE1a for even addresses is connected to the global read bit lines RGE1a, RGE1b for even addresses. A pair of local read bit lines RLE1aa, RLE1ab for even addresses is connected to the local read amplifier RAE1a for even addresses. The local read bit lines RLE1aa, RLE1ab for even addresses are connected to the read transistors RTr1a, RTr1b in the memory cells M001, M201 for even addresses, respectively. The local read amplifier RAE1a for even addresses is configured to supply the voltage to each of the global read bit lines RGE1a, RGE1b for even addresses, based on the voltage on the local read bit lines RLE1aa, RLE1ab for even addresses. A local read precharge circuit RPE1a is connected to the local read bit lines RLE1aa, RLE1ab for even addresses. The local read precharge circuit RPE1a is configured to precharge the high level voltage to each of the local read bit lines RLE1aa, RLE1ab for even addresses.

Further, a local write amplifier WAE1b for even addresses is connected to the global write bit liens WGE1a, WGE1b for even addresses. A pair of local write bit lines WLE1ba, WLE1bb for even addresses is connected to the local write amplifier WAE1b for even addresses. The local write amplifier WAE1b for even addresses is configured to supply the voltage to the local write bit lines WLE1ba, WLE1bb for even addresses, based on the voltage on the global write bit lines WGE1a, WGE1b for even addresses. The local write bit lines WLE1ba, WLE1bb for even addresses are connected to the write transistors WTr1a, WTr1b in the memory cells M401, M601 for even addresses, respectively. Also, a local write precharge circuit WPE1b for even addresses is connected to the local write bit lines WLE1ba, WLE1bb for even addresses. The local write precharge circuit WPE1b for even addresses is configured to precharge the high level voltage to each of the local write bit lines WLE1ba, WLE1bb for even addresses.

Further, a local read amplifier RAE1b for even addresses is connected to the global read bit lines RGE1a, RGE1b for even addresses. A pair of local read bit lines RLE1ba, RLE1bb for even addresses is connected to the local read amplifier RAE1b for even addresses. The local read bit lines RLE1ba, RLE1bb for even addresses are connected to the read transistors RTr1a, RTr1b in the memory cells M401, M601 for even addresses, respectively. The local read amplifier RAE1b for even addresses is configured to supply the voltage to the global read bit lines RGE1a, RGE1b for even addresses, based on the voltage on the local read bit lines RLE1ba, RLE1bb for even addresses. Also, a local read precharge circuit RPE1b for even addresses is connected to the local read bit lines RLE1ba, RLE1bb for even addresses. The local read precharge circuit RPE1b for even addresses is configured to precharge the high level voltage to each of the local read bit lines RLE1ba, RLE1bb for even addresses.

The memory array 220 for even addresses further includes a pair of global write bit lines WGE9a, WGE9b for even addresses. A local write amplifier WAE9a for even addresses is connected to the global write bit lines WGE9a, WGE9b. A pair of local write bit lines WLE9aa, WLE9ab for even addresses is connected to the local write amplifier WAE9a for even addresses. The local write amplifier WAE9a for even addresses is configured to supply the voltage to the local write bit lines WLE9aa, WLE9ab for even addresses, based on the voltage on the global write bit lines WGE9a, WGE9b for even addresses. The local write bit lines WLE9aa, WLE9ab for even addresses are connected to the write transistors WTr1a, WTr1b in the memory cells M009, M209 for even addresses, respectively. Further, a local write precharge circuit WPE9a for even addresses is connected to the local write bit lines WLE9aa, WLE9ab for even addresses. The local write precharge circuit WPE9a for even addresses is configured to precharge the high voltage to each of the local write bit lines WLE9aa, WLE9ab for even addresses.

Also, a local read amplifier RAE9a for even addresses is connected to global read bit lines RGE9a, RGE9b for even addresses. A pair of local read bit lines RLE9aa, RLE9ab for even addresses is connected to the local read amplifier RAE9a for even addresses. The local read bit lines RLE9aa, RLE9ab for even addresses are connected to the read transistors RTr1a, RTr1b in the memory cells M009, M209, respectively. The local read amplifier RAE9a for even addresses is configured to supply the voltage to the global read bit lines RGE9a, RGE9b for even addresses, based on the voltage on the local read bit lines RLE9aa, RLE9ab for even addresses. Also, a local read precharge circuit RPE9a for even addresses is connected to the local read bit lines RLE9aa, RLE9ab for even addresses. The local read precharge circuit RPE9a for even addresses is configured to precharge the high level voltage to each of the local read bit lines RLE9aa, RLE9ab for even addresses.

Further, a local write amplifier WAE9b for even addresses is connected to the global write bit lines WGE9a, WGE9b for even addresses. A pair of local write bit lines WLE9ba, WLE9bb for even addresses is connected to the local write amplifier WAE9b for even addresses. The local write amplifier WAE9b for even addresses is configured to supply the voltage to each of the local write bit liens WLE9ba, WLE9bb for even addresses, based on the voltage on the global write bit lines WGE9a, WGE9b for even addresses. The local write bit lines WLE9ba, WLE9bb for even addresses are connected to the write transistors WTr1a, WTr1b in the memory cells M409, M609 for even addresses, respectively. Also, a local write precharge circuit WPE9b is connected to the local write bit lines WLE9ba, WLE9bb for even addresses. The local write precharge circuit WPE9b is configured to precharge the high level voltage to each of the local write bit lines WLE9ba, WLE9bb for even addresses.

Further, a local read amplifier RAE9b for even addresses is connected to the global read bit lines RGE9a, RGE9b for even addresses. A pair of read bit lines RLE9ba, RLE9bb for even addresses is connected to the local read amplifier RAE9b for even addresses. The local read bit lines RLE9ba, RLE9bb for even addresses are connected to the read transistors RTr1a, RTr1b in the memory cells M409, M609 for even addresses, respectively. The local read amplifier RAE9b for even addresses is configured to supply the voltage to each of the global read bit lines RGE9a, RGE9b for even addresses, based on the voltage on the local read bit lines RLE9ba, RLE9bb for even addresses. Also, a local read precharge circuit RPE9b for even addresses is connected to the local read bit lines RLE9ba, RLE9bb for even addresses. The local read precharge circuit RPE9b for even addresses is configured to precharge the high level voltage to each of the local read bit lines RLE9ba, RLE9bb for even addresses.

A local write amplifier WAE24a for even addresses is connected to global write bit lines WGE24a, WGE24b for even addresses. A pair of local write bit lines WLE24aa, WLE24ab for even addresses is connected to the local write amplifier WAE24a for even addresses. The local write amplifier WAE24a for even addresses is configured to supply the voltage to the local write bit lines WLE24aa, WLE24ab for even addresses, based on the voltage on the global write bit lines WGE24a, WGE24b for even addresses. The local write bit lines WLE24aa, WLE24ab for even addresses are connected to the write transistors WTr1a, WTr1b in the memory cells M024, M224 for even addresses, respectively. Also, a local write precharge circuit WPE24a for even addresses is connected to the local write bit lines WLE24aa, WLE24ab for even addresses. The local write precharge circuit WPE24a for even addresses is configured to precharge the high level voltage to the local write bit lines WLE24aa, WLE24ab for even addresses.

Also, a local read amplifier RAE24a for even addresses is connected to global read bit lines RGE24a, RGE24b for even addresses. A pair of local read bit lines RLE24aa, RLE24ab for even addresses is connected to the local read amplifier RAE24a for even addresses. The local read bit lines RLE24aa, RLE24ab for even addresses are connected to the read transistors RTr1a, RTr1b in the memory cells M024, M224 for even addresses, respectively. The local read amplifier RAE24a for even addresses is configured to supply the voltage to the global read bit lines RGE24a, RGE24b for even addresses, based on the voltage on the local read bit lines RLE24aa, RLE24ab for even addresses. Also, a local read precharge circuit RPE24a for even addresses is connected to the local read bit lines RLE24aa, RLE24ab for even addresses. The local read precharge circuit RPE24a for even addresses is configured to precharge the high level voltage to the local read bit lines RLE24aa, RLE24ab for even addresses.

Further, a local write amplifier WAE24b for even addresses is connected to the global write bit lines WGE24a, WGE24b for even addresses. A pair of local write bit lines WLE24ba, WLE24bb for even addresses is connected to the local write amplifier WAE24b for even addresses. The local write amplifier WAE24b for even addresses is configured to supply the voltage to each of the local write bit lines WLE24ba, WLE24bb for even addresses, based on the voltage on the global write bit lines WGE24a, WGE24b for even addresses. The local write bit lines WLE24ba, WLE24bb for even addresses are connected to the write transistors WTr1a, WTr1b in the memory cells M424, M624, respectively. Also, a local write precharge circuit WPE24b for even addresses is connected to the local write bit lines WLE24ba, WLE24bb for even addresses. The local write precharge circuit WPE24b for even addresses is configured to precharge the high level voltage to each of the local write bit lines WLE24ba, WLE24bb for even addresses.

Further, a local read amplifier RAE24b for even addresses is connected to the global read bit lines RGE24a, RGE24b for even addresses. A pair of read bit lines RLE24ba, RLE24bb for even addresses is connected to the local read amplifier RAE24b for even addresses. The local read bit lines RLE24ba, RLE24bb for even addresses are connected to the read transistors RTr1a, RTr1b in the memory cells M424, M624 for even addresses, respectively. The local read amplifier RAE24b for even addresses is configured to supply the voltage to each of the global read bit lines RGE24a, RGE24b for even addresses, based on the voltage on the local read bit lines RLE24ba, RLE24bb for even addresses. Also, a local read precharge circuit RPE24b for even addresses is connected to the local read bit lines RLE24ba, RLE24bb for even addresses. The local read precharge circuit RPE24b for even addresses is configured to precharge the high level voltage to the local read bit lines RLE24ba, RLE24bb for even addresses.

With reference again to FIG. 7, a global write precharge circuit 240 for even addresses is configured to precharge the high level voltage to each of the plurality of global write bit lines WGE1a, WGE1b, . . . , WGE24a, WGE24b for even addresses, shown in FIG. 8. A global write amplifier 230 for even addresses, shown in FIG. 7, is configured to write the even addressed data to each of the plurality of memory cells M001-M024, M201-M224, M401-M424, M601-M624 for even addresses, shown in FIG. 8, through each of the plurality of global write bit lines WGE1a, WGE1b, WGE24a, WGE24b for even addresses. A global read precharge circuit 242 for even addresses, shown in FIG. 7, is configured to precharge the high level voltage to each of the plurality of global read bit lines RGE1a, RGE1b, . . . , RGE24a, RGE24b for even addresses, shown in FIG. 8. A global read amplifier 250 for even addresses, shown in FIG. 7, is configured to read the even addressed data from each of the plurality of memory cells M001-M024 M201-M224, M401-M424, M601-M624 for even addresses, through each of the plurality of global read bit lines RGE1a, RGE1b, . . . , RGE24a, RGE24b for even addresses, shown in FIG. 8.

Figure 9:
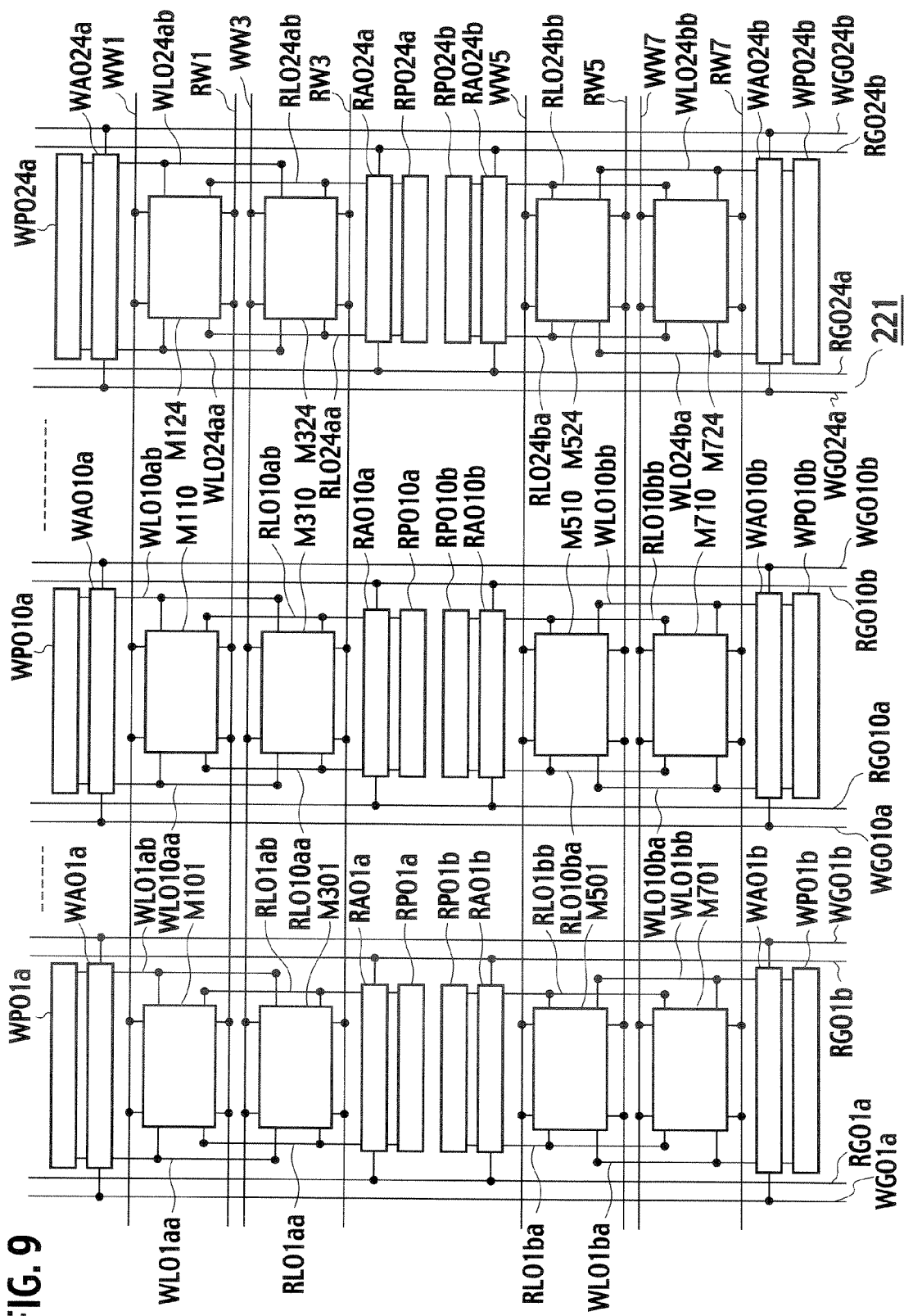
FIG. 9 is a second circuit diagram of the memory array of the semiconductor memory in accordance with the second embodiment of the present invention.

With reference next to FIG. 9, the memory array 221 for odd addresses, according to the second embodiment, includes the plurality of memory cells M101-M124, M301-M324, M501-M524, M701-M724 for odd addresses arranged in the array of four rows and 24 columns. Each of the plurality of memory cells M101-M124, M301-M324, M501-M524, M701-M724 for odd addresses is the one read and one write SRAM cell, shown in FIG. 3. As shown in FIG. 9, the memory array 221 for odd addresses includes a pair of global write bit lines WGO1a, WGO1b for odd addresses. A local write amplifier WAO1a for odd addresses is connected to the global write bit lines WGO1a, WGO1b for odd addresses. A pair of local write bit lines WLO1aa, WLO1ab for odd addresses is connected to the local write amplifier WAO1a for odd addresses. The local write amplifier WAO1a for odd addresses is configured to supply the voltage to each of the local write bit lines WLO1aa, WLO1ab for odd addresses, based on the voltage on the global write bit lines WGO1a, WGO1b for odd addresses. The local write bit lines WLO1aa, WLO1ab for odd addresses are connected to the write transistors WTr1a, WTr1b in the memory cells M101, M301 for odd addresses, respectively Also, a local write precharge circuit WPO1a for odd addresses is connected to the local write bit lines WLO1aa, WLO1ab for odd addresses. The local write precharge circuit WPO1a for odd addresses is configured to precharge the high level voltage to each of the local write bit lines WLO1aa, WLO1ab for odd addresses.

Also, a local read amplifier RAO1a for odd addresses is connected to global read bit lines RGO1a, RGO1a for odd addresses. A pair of local read bit lines RLO1aa, RLO1ab for odd addresses is connected to the local read amplifier RAO1a for odd addresses. The local read bit lines RLO1aa, RLO1ab for odd addresses are connected to the read transistors RTr1a, RTr1b in the memory cells M101, M301 for odd addresses, respectively. The local read amplifier RAO1a for odd addresses is configured to supply the voltage to each of the global read bit lines RGO1a, RGO1b for odd addresses, based on the voltage on the local read bit lines RLO1aa, RLO1ab for odd addresses. Also, a local read precharge circuit RPO1*a* for odd addresses is connected to the local read bit lines RLO1*aa*, RLO1*ab* for odd addresses. The local read precharge circuit RPO1*a* for odd addresses is configured to precharge the high level voltage to each of the local read bit lines RLO1*aa*, RLO1*ab* for odd addresses.

Further, a local write amplifier WAO1*b* for odd addresses is connected to the global write bit lines WGO1*a*, WGO1*b* for odd addresses. A pair of local write bit lines WLO1*ba*, WLO1*bb* for odd addresses is connected to the local write amplifier WAO1*b* for odd addresses. The local write amplifier WAO1*b* for odd addresses is configured to supply the voltage to each of the local write bit lines WLO1*ba*, WLO1*bb* for odd addresses, based on the voltage on the global write bit lines WGO1*a*, WGO1*b* for odd addresses. The local write bit lines WLO1*ba*, WLO1*bb* for odd addresses is connected to the write transistors WTr1*a*, WTr1*b* in the memory cells M501, M701 for odd addresses, respectively. Also, a local write precharge circuit WPO1*b* for odd addresses is connected to the local write bit lines WLO1*ba*, WLO1*bb* for odd addresses. The local write precharge circuit WPO1*b* for odd addresses is configured to precharge the high level voltage to each of the local write bit lines WLO1*ba*, WLO1*bb* for odd addresses.

Further, a local read amplifier RAO1*b* for odd addresses is connected to the global read bit lines RGO1*a*, RGO1*b* for odd addresses. A pair of local read bit lines RLO1*ba*, RLO1*bb* for odd addresses is connected to the local read amplifier RAO1*b* for odd addresses. The local read bit lines RLO1*ba*, RLO1*bb* for odd addresses are connected to the read transistors RTr1*a*, RTr1*b* in the memory cells M501, M701 for odd addresses, respectively. The local read amplifier RAO1*b* for odd addresses is configured to supply the voltage to each of the global read bit lines RGO1*a*, RGO1*b* for odd addresses, based on the voltage on the local read bit lines RLO1*ba*, RLO1*bb* for odd addresses. Also, a local read precharge circuit RPO1*b* for odd addresses is connected to the local read bit lines RLO1*ba*, RLO1*bb* for odd addresses. The local read precharge circuit RPO1*b* for odd addresses is configured to precharge the high level voltage to each of the local read bit lines RLO1*ba*, RLO1*bb* for odd addresses.

A local write amplifier WAO10*a* for odd addresses is connected to global write bit lines WGO10*a*, WGO10*b* for odd addresses. A pair of local write bit lines WLO10*aa*, WLO10*ab* for odd addresses is connected to the local write amplifier WAO10*a* for odd addresses. The local write amplifier WAO10*a* for odd addresses is configured to supply the voltage to each of the local write bit lines WLO10*aa*, WLO10*ab* for odd addresses, based on the voltage on the global write bit lines WGO10*a*, WGO10*b* for odd addresses. The local write bit lines WLO10*aa*, WLO10*ab* for odd addresses are connected to the write transistors WTr1*a*, WTr1*b* in the memory cells M110, M310 for odd addresses, respectively. Also, a local write precharge circuit WPO10*a* for odd addresses is connected to the local write bit lines WLO10*aa*, WLO10*ab* for odd addresses. The local write precharge circuit WPO10*a* for odd addresses is configured to precharge the high level voltage to each of the local write bit lines WLO10*aa*, WLO10*ab* for odd addresses.

Also, a local read amplifier RAO10*a* for odd addresses is connected to the global read bit lines RGO10*a*, RGO10*b* for odd addresses. A pair of local read bit lines RLO10*aa*, RLO10*ab* for odd addresses is connected to the local read amplifier RAO10*a* for odd addresses. The local read bit lines RLO10*aa*, RLO10*ab* for odd addresses are connected to the read transistors RTr1*a*, RTr1*b* in the memory cells M110, M310 for odd addresses, respectively. The local read amplifier RAO10*a* for odd addresses is configured to supply the voltage to each of the global read bit lines RGO10*a*, RGO10*b* for odd addresses, based on the voltage on the local read bit lines RLO10*aa*, RLO10*ab* for odd addresses Also, a local read precharge circuit RPO10*a* for odd addresses is connected to the local read bit lines RLO10*aa*, RLO10*ab* for odd addresses. The local read precharge circuit RPO10*a* for odd addresses is configured to precharge the high level voltage to each of the local read bit lines RLO10*aa*, RLO10*ab* for odd addresses.

Further, a local write amplifier WAO10*b* for odd addresses is connected to the global write bit lines WGO10*a*, WGO10*b* for odd addresses. A pair of write bit lines WLO10*ba*, WL010*bb* for odd addresses is connected to the local write amplifier WAO10*b* for odd addresses. The local write amplifier WAO10*b* for odd addresses is configured to supply the voltage to each of the local write bit lines WLO10*ba*, WLO10*bb* for odd addresses, based on the voltage on the global write bit lines WGO10*a*, WGO10*b* for odd addresses. The local write bit lines WLO10*ba*, WLO10*bb* for odd addresses are connected to the write transistors WTr1*a*, WTr1*b* in the memory cells M510, M710 for odd addresses. Also, a local write precharge circuit WPO10*b* for odd addresses is connected to the local write bit lines WLO10*ba*, WLO10*bb* for odd addresses. The local write precharge circuit WPO10*b* for odd addresses is configured to precharge the high level voltage to each of the local write bit lines WL010*ba*, WLO10*bb* for odd addresses.

Further, a local read amplifier RAO10*b* for odd addresses is connected to the global read bit lines RGO10*a*, RGO10*b* for odd addresses. A pair of local read bit lines RLO10*ba*, RLO1*bb* for odd addresses is connected to the local read amplifier RA010*b* for odd addresses. The local read bit lines RLO10*ba*, RLO10*bb* for odd addresses are connected to the read transistors RTr1*a*, RTr1*b* in the memory cells M510, M710 for odd addresses. The local read amplifier RAO10*b* for odd addresses is configured to supply the voltage to the global read bit lines RGO10*a*, RGO10*b*, based on the voltage on the local read bit lines RLO10*ba*, RLO10*bb* for odd addresses. Also, a local read precharge circuit RPO10*b* for odd addresses is connected to the local read bit lines RLO10*ba*, RLO10*bb* for odd addresses. The local read precharge circuit RPO10*b* for odd addresses is configured to precharge the high level voltage to each of the local read bit lines RLO10*ba*, RLO10*bb* for odd addresses.

A local write amplifier WAO24*a* for odd addresses is connected to global write bit lines WGO24*a*, WGO24*b* for odd addresses. A pair of local write bit lines WLO24*aa*, WLO24*ab* for odd addresses is connected to the local write amplifier WA024*a* for odd addresses. The local write amplifier WAO24*a* for odd addresses is configured to supply the voltage to the local write bit lines WLO24*aa*, WLO24*ab* for odd addresses, based on the voltage on the global write bit lines WGO24*a*, WGO24*b* for odd addresses. The local write bit lines WLO24*aa*, WLO24*ab* for odd addresses are connected to the write transistors WTr1*a*, WTr1*b* in the memory cells M124, M324 for odd addresses. Also, a local write precharge circuit WPO24*a* for odd addresses is connected to the local write bit lines WLO24*aa*, WLO24*ab* for odd addresses. The local write precharge circuit WPO24*a* for odd addresses is configured to precharge the high level voltage to each of the local write bit liens WLO24*aa*, WLO24*ab* for odd addresses.

Further, a local read amplifier RAO24*a* for odd addresses is connected to global read bit lines RGO24*a*, RGO24*b* for odd addresses. A pair of local read bit lines RLO24*aa*, RLO24*ab* for odd addresses is connected to the local read amplifier RAO24*a* for odd addresses. The local read bit lines RLO24aa, RLO24ab for odd addresses are connected to the read transistors RTr1a, RTr1b in the memory cells M124, M324 for odd addresses. The local read amplifier RAO24a for odd addresses is configured to supply the voltage to each of the global read bit lines RGO24a, RGO24b for odd addresses, based on the voltage on the local read bit lines RLO24aa, RLO24ab for odd addresses. Also, a local read precharge circuit RPO24a for odd addresses is connected to the local read bit lines RLO24aa, RLO24ab for odd addresses. The local read precharge circuit RPO24a for odd addresses is configured to precharge the high level voltage to each of the local read bit lines RLO24aa, RLO24ab for odd addresses.

Further, a local write amplifier WAO24b for odd addresses is connected to the global write bit lines WGO24a, WGO24b for odd addresses. A pair of local write bit lines WLO24ba, WLO24bb for odd addresses is connected to the local write amplifier WAO24b for odd addresses. The local write amplifier WAO24b for odd addresses is configured to supply the voltage to each of the local write bit lines WLO24ba, WLO24bb for odd addresses, based on the voltage on the global write bit lines WGO24a, WGO24b for odd addresses. The local write bit lines WLO24ba, WLO24bb for odd addresses are connected to the write transistors WTr1a, WTr1b in the memory cells M524, M724 for odd addresses, respectively. Also, a local write precharge circuit WPO24b for odd addresses is connected to the local write bit lines WLO24ba, WLO24bb for odd addresses. The local write precharge circuit WPO24b for odd addresses is configured to precharge the high level voltage to each of the local write bit lines WLO24ba, WLO24bb for odd addresses.

Further, a local read amplifier RAO24b for odd addresses is connected to the global read bit lines RGO24a, RGO24b for odd addresses. A pair of local read bit lines RLO24ba, RLO24bb for odd addresses is connected to the local read amplifier RAO24b for odd addresses. The local read bit lines RLO24ba, RLO24bb for odd addresses are connected to the read transistors RTr1a, RTr1b in the memory cells M524, M724 for odd addresses, respectively. The local read amplifier RAO24b for odd addresses is configured to supply the voltage to the global read bit lines RGO24a, RGO24b for odd addresses, based on the voltage on the local read bit lines RLO24ba, RLO24bb for odd addresses. Also, a local read precharge circuit RPO24b for odd addresses is connected to the local read bit lines RLO24ba, RLO24bb for odd addresses. The local read precharge circuit RPO24b for odd addresses is configured to precharge the high level voltage to each of the local read bit lines RLO24ba, RLO24bb for odd addresses.

With reference again to FIG. 7, a global write precharge circuit 241 for odd addresses is configured to precharge the high level voltage to each of the plurality of global write bit lines WGO1b, . . . , WGO24a, WGO24b for odd addresses, shown in FIG. 9. A global write amplifier 231 for odd addresses, shown in FIG. 7, is configured to write the odd addresses data to each of the plurality of memory cells M101-M124, M301-M324, M501-M524, M701-M724 for odd addresses, shown in FIG. 9, through each of the global write bit lines WGO1a, WGO1b, . . . , WGO24a, WGO24b for odd addresses. A global read precharge circuit 243 for odd addresses, shown in FIG. 7, is configured to precharge the high level voltage to each of the plurality of global read bit lines RGO1a, RGO1b, . . . , RGO24a, RGO24b for odd addresses, shown in FIG. 7. A global read amplifier 251 for odd addresses, shown in FIG. 7, is configured to read the odd addressed data from each of the plurality of memory cells M101-M124, M301-M324, M501-M524, M701-M724 for odd addresses, shown in FIG. 9, through each of the plurality of global read bit lines RGO1a, RGO1b, . . . , RGO24a, RGO24b for odd addresses.

Next, an example of the write operation of the semiconductor memory, according to the second embodiment, shown in FIGS. 7-9, is described. Here, the start row address for sequential data to be written in the semiconductor memory is "1". The start column address for sequential data to be written in the semiconductor memory is "10". The end row address for sequential data to be written in the semiconductor memory is "2". The end column address for sequential data to be written in the semiconductor memory is "9". Therefore, the sequential data are written in the semiconductor memory over two rows.

The global write amplifier 231 for odd addresses, shown in FIG. 7, supplies the high level voltage to each of the global write bit lines WGO10a-WGO24a for odd addresses, shown in FIG. 9. The plurality of local write amplifiers WAO10a-WAO24a for odd addresses supply the high level voltage signals to the plurality of local write bit lines WLO10aa-WLO24aa for odd addresses, based on changes of the voltages on the plurality of global write bit lines WGO10a-WGO24a for odd addresses, respectively.

Also, the global write amplifier 231 for odd addresses, shown in FIG. 7, supplies the low level voltage signal to another plurality of global write bit lines WGO10b-WGO24b for odd addresses, shown in FIG. 9. The plurality of local write amplifiers WAO10a-WAO24a supply the low level voltage signals to another plurality of local write bit lines WLO10ab-WLO24ab for odd addresses, based on the changes of the voltages on the plurality of global write bit lines WGO10b-WGO24b for odd addresses, respectively.

The write decoder 61 for odd addresses, shown in FIG. 7, supplies the high level voltage as the odd address signal for the write operation to the write word line WW1 for odd addresses, shown in FIG. 9. Consequently, the states of write transistors WTr1a, WTr1b, shown in FIG. 3, within each of the plurality of memory cells M101-M124 for odd addresses go from the off state to the on state. Therefore, the odd addressed data associated with the row address "1" and the column address "10" is written in the node of the write transistor WTr1a within the memory cell M110 for odd address, shown in FIG. 9. Also, the plurality of odd addressed data associated with the row address "1" and corresponding column addresses are written in the plurality of memory cells M111-M124 for odd address, respectively.

The global write amplifier 230 for even addresses, shown in FIG. 7, supplies the high level voltage signals to the plurality of global write bit lines WGE1a-WGE9a for even addresses, shown in FIG. 8. The plurality of local write amplifiers WAE1a-WAE9a for even addresses supply the high level voltage signals to the plurality of local write bit lines WLE1aa-WLE9aa for even addresses, based on the changes of the voltages on the plurality of global write bit lines WGE1a-WGE9a for even addresses, respectively.

Also, the global write amplifier 230 for even addresses, shown in FIG. 7, supplies the low level voltage signal to another plurality of global write bit lines WGE1b-WGE9b for even addresses, shown in FIG. 8. The plurality of local write amplifiers WAE1a-WAE9a for even addresses supply the low level voltage signals to another plurality of local write bit lines WLE1ab-WLE9ab for even addresses, based on the changes of the voltages on the plurality of global write bit lines WGE1b-WGE9b for even addresses.

The write decoder 60 for even addresses, shown in FIG. 7, applies the high level voltage as the even address signal for the write operation to the write word line WW2 for even addresses, shown in FIG. 8. Consequently, the states of write transistors WTr1a, WTr1b, shown in FIG. 3, within each of the plurality of memory cells M201-M224 for even addresses go from the off state to the on state. Therefore, the even addressed data associated with the row address "2" and the column address "1" is written in the node of the write transistor WTr1a within the memory cell M201 for even address, shown in FIG. 8. The plurality of even addressed data associated with the row address "2" and corresponding column addresses are also written in the plurality of memory cells M202-M209 for even addresses, respectively, and the write operation of the sequential data is completed.

Next, an example of the read operation of the semiconductor memory, according to the second embodiment, shown in FIGS. 7-9, is described. Here, the start row address for the sequential data to be read from the semiconductor memory is "1". The start column address for the sequential data to be read from the semiconductor memory is "10". And the end row address for the sequential data to be read from the semiconductor memory is "2". The end column address for the sequential data to be read from the semiconductor memory is "9". Therefore, the sequential data are read from the semiconductor memory over two rows.

The global read precharge circuit 243 for odd addresses precharges the high level voltage to the plurality of global read bit lines RGO10a-RGO24a, shown in FIG. 9. The plurality of local read precharge circuits RPO10a-RPO24a for odd addresses precharge the high level voltages to the plurality of local read bit lines RLO10aa-RL024aa, based on the changes of the voltages on the plurality of global read bit lines RGO10a-RGO24a for odd addresses.

The read decoder 63 for odd addresses, shown in FIG. 7, supplies the high level voltage as the odd address signal for the read operation to the read word line RW1 for odd addresses, shown in FIG. 9. Consequently, the states of read transistors RTr1a, RTr1b, shown in FIG. 3, within each of the plurality of memory cells M110-M124 for odd addresses go from the off state to the on state.

When the high level voltage signal corresponding to the odd addressed data associated with the row address "1" and the column address "10" is stored in the node of the read transistor RTr1a within the memory cell M110 for odd address, the voltage on the local read bit line RLO10aa for odd addresses remains high after the read transistor RTr1a goes from the off state to the on state.

The local read amplifier RAO10a for odd addresses amplifies the high level voltage signal transmitted by the local read bit lines RLO10aa for odd addresses. The local read amplifier RAO10a for odd addresses transfers the amplified high level voltage signal to the global read bit line RGO10a for odd addresses. The global read amplifier 251 for odd addresses, shown in FIG. 7, reads the odd addressed data associated with the row address "1" and the column address "10" stored in the memory cell M110 for odd address, based on the voltage on the global read bit line RGO10a for odd addresses. Also, the global read amplifier 251 for odd addresses reads the odd addressed data stored in each of the plurality of memory cells M110-M124 for odd addresses.

Also, the global read precharge circuit 242 for even addresses precharges the high level voltage to the plurality of read bit lines RGE1a-RGE9a for even addresses, shown in FIG. 8. The plurality of local read precharge circuits RPE1a-RPE9a for even addresses precharge the high level voltages to the plurality of local read bit lines RLE1aa-RLE9aa for even addresses, based on the changes of the voltages on the plurality of global read bit lines RGE1a-RGE9a for even addresses.

The read decoder 62 for even addresses, shown in FIG. 7, supplies the high level voltage as the even address signal for the read operation to the read word line RW2 for even addresses, shown in FIG. 8. Consequently, the states of read transistor RTr1a, RTr1b, shown in FIG. 3, within each of the plurality of memory cells M201-M209 for even addresses go from the off state to the on state.

When the high level voltage signal corresponding to the even addressed data associated with the row address "2" and the column address "1" is stored in the node of the read transistor RTr1a within the memory cell M201 for even address, shown in FIG. 8, the voltage on the local read bit line RLE1aa for even addresses remains high after the read transistor RTr1a goes from the off state to the on state.

The local read amplifier RAE1a for even addresses amplifies the high level voltage signal transmitted by the local read bit lines RLE1aa for even addresses. The local read amplifier RAE1a for even addresses transfers the amplified high level voltage signal to the global read bit line RGE1a for even addresses. The global read amplifier 250 for even addresses, shown in FIG. 7, reads the even addressed data associated with the row address "2" and the column address "1" stored in the memory cell M201 for even address, based on the voltage on the global read bit line RGE1a for even addresses The global read amplifier 250 for even addresses also reads the even addressed data stored in each of the plurality of memory cells M202-M209 for even addresses, and the read operation of the sequential data is completed.

As described above, the semiconductor memory having the hierarchical bit line architecture makes it possible to write and read the sequential data over the plurality of rows, correctly, even though the semiconductor memory uses the plurality of one read and one write SRAM cells.

Other Embodiments

Although the invention has been described above by reference to the embodiments of the present invention, the present invention is not limited to the embodiments described above. Modifications and variations of the embodiments described above will occur to those skilled in the art, in the light of the above teachings. For example, in FIG. 1, the memory array 20 for even addresses is next to the memory array 21 for odd addresses. However, the memory array 20 for even addresses and the memory array 21 for odd addresses are connected to the independent read amplifiers and the independent write amplifiers, respectively. Therefore, there is no need to dispose the memory array 20 for even addresses next to the memory array 21 for odd addresses. Disposing the memory array 20 for even addresses apart from the memory array 21 for odd addresses is an alternative. Also, disposing the memory array 220 for even addresses, shown in FIG. 7, apart form the memory array 221 for odd addresses is the alternative. As described above, the present invention includes many variations of the embodiments. Therefore, the scope of the invention is defined with reference to the following claims.

What is claimed is:

1. A semiconductor memory comprising:
a plurality of memory cells for even addresses arranged in a memory array for even addresses and configured to store even addressed data, the even addressed data being associated with even row addresses;
a plurality of write word lines for even addresses arranged parallel to a row direction of the memory array for even addresses and configured to select the plurality of memory cells for even addresses in the row direction of the memory array for even addresses to write the even addressed data;

a plurality of write bit lines for even addresses arranged parallel to a column direction of the memory array for even addresses and configured to transfer the even addressed data to the plurality of memory cells for even addresses in the column direction of the memory array for even addresses;

a plurality of memory cells for odd addresses arranged in a memory array for odd addresses and configured to store odd addressed data, the odd addressed data being associated with odd row addresses;

a plurality of write word lines for odd addresses arranged parallel to a row direction of the memory array for odd addresses and configured to select the plurality of memory cells for odd addresses in the row direction of the memory array for odd addresses to write the odd addressed data; and a plurality of write bit lines for odd addresses arranged parallel to a column direction of the memory array for odd addresses and configured to transfer the odd addressed data to the plurality of memory cells for odd addresses in the column direction of the memory array for odd addresses.

2. The semiconductor memory of claim 1, further comprising a plurality of read word lines for even addresses arranged parallel to the row direction of the memory array for even addresses and configured to select the plurality of memory cells for even addresses in the row direction of the memory array for even addresses to read the even addressed data.

3. The semiconductor memory of claim 1, further comprising a plurality of read bit lines for even addresses arranged parallel to the column direction of the memory array for even addresses and configured to transfer the even addressed data from the plurality of memory cells for even addressed data in the column direction of the memory array for even addresses.

4. The semiconductor memory of claim 1, further comprising a write decoder for even addresses configured to transfer an even address signal for a write operation to each of the plurality of write word lines for even addresses.

5. The semiconductor memory of claim 2, further comprising a read decoder for even addresses configured to transfer an even address signal for a read operation to each of the plurality of read word lines for even addresses.

6. The semiconductor memory of claim 1, further comprising a write precharge circuit for even addresses configured to precharge each of the plurality of write word lines for even addresses.

7. The semiconductor memory of claim 1, further comprising a write amplifier for even addresses configured to transfer the even addressed data to each of the plurality of write bit lines for even addresses.

8. The semiconductor memory of claim 3, further comprising a read precharge circuit for even addresses configured to precharge each of the plurality of read bit lines for even addresses.

9. The semiconductor memory of claim 3, further comprising a read amplifier configured to read the even addressed data from each of the memory cells for even addresses, through each of the plurality of read bit lines for even addresses.

10. The semiconductor memory of claim 1, further comprising a plurality of read bit lines for odd addresses arranged parallel to the row direction of the memory array for odd addresses and configured to select the plurality of memory cells for odd addresses in the row direction of the memory array for odd addresses to read the odd addressed data.

11. The semiconductor memory of claim 1, further comprising a plurality of read bit lines for odd addresses arranged parallel to the column direction of the memory array for odd addresses and configured to transfer the odd addressed data from the plurality of memory cells for odd addresses in the column direction of the memory array for odd addresses.

12. The semiconductor memory of claim 1, further comprising a write decoder for odd addresses configured to transfer an odd address signal for a write operation to each of the plurality of write word lines for odd addresses.

13. The semiconductor memory of claim 10, further comprising a read decoder for odd addresses configured to transfer an odd address signal for a read operation to each of a plurality of read word lines for odd addresses.

14. The semiconductor memory of claim 1, further comprising a write precharge circuit for odd addresses configured to precharge each of the plurality of write bit lines for odd addresses.

15. The semiconductor memory of claim 1, further comprising a write amplifier for odd addresses configured to transfer the odd addressed data to each of the plurality of write bit lines for odd addresses.

16. The semiconductor memory of claim 11, further comprising a read precharge circuit for odd addresses configured to precharge each of the plurality of read bit lines for odd addresses.

17. The semiconductor memory of claim 11, further comprising a read amplifier for odd addresses configured to read the odd addressed data from each of the plurality of memory cells for odd addresses, through each of the plurality of read bit lines for odd addresses.

* * * * *